US012813077B2

(12) United States Patent
Ueda et al.

(10) Patent No.: US 12,813,077 B2
(45) Date of Patent: Nov. 24, 2026

(54) LIGHT EMITTING DEVICE

(71) Applicant: SHARP KABUSHIKI KAISHA, Sakai City (JP)

(72) Inventors: Masaya Ueda, Sakai City (JP); Hirohisa Yamada, Sakai City (JP); Yoshihiro Ueta, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 528 days.

(21) Appl. No.: 18/269,566

(22) PCT Filed: Dec. 25, 2020

(86) PCT No.: PCT/JP2020/048841
§ 371 (c)(1),
(2) Date: Jun. 25, 2023

(87) PCT Pub. No.: WO2022/137539
PCT Pub. Date: Jun. 30, 2022

(65) Prior Publication Data
US 2024/0057365 A1 Feb. 15, 2024

(51) Int. Cl.
*H10K 50/115* (2023.01)
*H10K 59/122* (2023.01)
(Continued)

(52) U.S. Cl.
CPC ......... *H10K 59/122* (2023.02); *H10K 50/115* (2023.02); *H10K 59/131* (2023.02); *H10K 59/805* (2023.02)

(58) Field of Classification Search
CPC ........... H10K 59/00–95; H10K 59/122; H10K 59/805; H10K 50/00–88; H10K 50/30;
(Continued)

(56) References Cited

U.S. PATENT DOCUMENTS

2004/0108807 A1 6/2004 Park
2013/0020963 A1 * 1/2013 Sakaguchi ............ H05B 45/60 315/250
(Continued)

FOREIGN PATENT DOCUMENTS

CN 110571243 A 12/2019
JP 2003031373 A * 1/2003
(Continued)

OTHER PUBLICATIONS

Futaboshi translation (Year: 2003).*

*Primary Examiner* — Steven B Gauthier
*Assistant Examiner* — Rhys Poniente Sheker
(74) *Attorney, Agent, or Firm* — ScienBiziP, P.C.

(57) ABSTRACT

A light-emitting device includes an anode, a cathode, a light-emitting layer disposed between the anode and the cathode, a first electrode disposed in a manner capable of generating a second electric field in the light-emitting layer in cooperation with one of the anode and the cathode, the second electric field bringing a total electric field, which is generated in the light-emitting layer and includes a first electric field generated in the light-emitting layer between the anode and the cathode, close to zero, and a first insulating film surrounding the first electrode in a cross-sectional view of the anode, the cathode, and the light-emitting layer.

12 Claims, 28 Drawing Sheets

(51) Int. Cl.
*H10K 59/131* (2023.01)
*H10K 59/80* (2023.01)

(58) Field of Classification Search
CPC ...... H10K 50/115; G09G 3/2003; G09G 3/32; G09G 3/3208; G09G 2300/0426; G09G 2310/0256
See application file for complete search history.

(56) References Cited

U.S. PATENT DOCUMENTS

| | | | | |
|---|---|---|---|---|
| 2014/0014939 | A1 | 1/2014 | Sakaguchi | |
| 2014/0054613 | A1* | 2/2014 | Facchetti | H10K 50/16 257/79 |
| 2014/0361256 | A1* | 12/2014 | Kim | H10K 50/824 257/40 |
| 2015/0125977 | A1 | 5/2015 | Sakaguchi | |
| 2016/0049603 | A1* | 2/2016 | Kleemann | H10K 10/84 257/40 |
| 2016/0126508 | A1 | 5/2016 | Sakaguchi | |
| 2021/0048904 | A1 | 2/2021 | Xia | |
| 2023/0044829 | A1* | 2/2023 | Helander | H10K 50/858 |
| 2023/0312604 | A1* | 10/2023 | Wang | H10K 85/6576 |

FOREIGN PATENT DOCUMENTS

| | | | |
|---|---|---|---|
| JP | 2004-522279 | A | 7/2004 |
| WO | 2012133716 | A1 | 10/2012 |

* cited by examiner

LIGHT EMITTING DEVICE

TECHNICAL FIELD

The disclosure relates to a light-emitting device.

BACKGROUND ART

For example, a light-emitting device having an organic light emitting diode (OLED) or a quantum dot light emitting diode (QLED) disclosed in the following JP 2004-522279 as a light-emitting layer has been developed. Such a light-emitting device includes a light-emitting layer between an anode and a cathode. In a light-emitting device, positive holes injected from the anode into the light-emitting layer are recombined with electrons injected from the cathode into the light-emitting layer. Thereby, light is emitted from the light-emitting layer. For this reason, the luminous efficiency of the light-emitting device is improved by facilitating the recombination of electrons and positive holes in the light-emitting layer.

In the above-described light-emitting device, for example, the light-emitting layer may include a core and a quantum dot covering the core. In this case, in order to improve luminous efficiency, it is conceivable to form a structure in which carriers are confined in the core by making a band gap of the core of the quantum dot smaller than a band gap of a shell covering the core. This is because, according to the above-described structure, the overlap of wave functions of positive holes and electrons increases as compared with a bulk state, and the probability of recombination of the positive holes and the electrons increases.

SUMMARY

Technical Problem

In the above-described light-emitting device, in a state where no voltage is applied between an anode and a cathode, a light-emitting material in a light-emitting layer, for example, a valence band and a conduction band of a core of a quantum dot can be regarded as having constant values at any position in the light-emitting layer. In other words, a graph of a band gap of the core in the light-emitting layer extends in a horizontal direction.

More specifically, in a state where no electric field is applied to the core, a wave function according to the level of electrons in a conduction band and a wave function according to the level of positive holes in a valence band are in mirror symmetry with respect to a center line of a quantum well. In addition, an overlap integral of the above-described two wave functions is maximized. Further, both a peak of a graph representing the wave function of the electrons in the conduction band and a peak of a graph representing the wave function of the positive holes in the valence band are located near the center line of the quantum well. That is, electrons and positive holes forming excitons are in a state where the probability of presence near the center of the quantum well is highest.

On the other hand, when a voltage is applied between the anode and the cathode, the band gap of the core of the quantum dot is inclined with respect to a horizontal line. For this reason, when an electric field is applied to the material of the core constituting the quantum well, electrons having negative charge move in a direction opposite to the electric field, and positive holes having positive charge move in the same direction as the electric field, whereby electrons and positive holes forming excitons are spatially separated from each other.

As a result, an overlap integral of wave functions becomes smaller, and the probability of recombination of excitons decreases. Thus, the internal quantum efficiency of a quantum dot decreases, and the luminous efficiency of the light-emitting device decreases.

At this time, a quantum level of the conduction band relatively increases, and a quantum level of the valence band relatively decreases. Thereby, when an electric field to be applied to the light-emitting layer increases, a difference in energy between the quantum levels of the conduction band and the valence band decreases, and an emission wavelength becomes longer.

The disclosure has been contrived in view of the problem described above. An object of the disclosure is to provide a light-emitting device with improved luminous efficiency.

Solution to Problem

According to a first aspect of the disclosure, there is provided a light-emitting device including an anode, a cathode, a light-emitting layer disposed between the anode and the cathode, a first electrode disposed in a manner capable of generating a second electric field in the light-emitting layer in cooperation with one of the anode and the cathode, the second electric field bringing a total electric field, which is generated in the light-emitting layer and includes a first electric field generated in the light-emitting layer between the anode and the cathode, close to zero, and a first insulating portion surrounding the first electrode in a cross-sectional view of the anode, the cathode, and the light-emitting layer.

According to a second aspect of the disclosure, there is provided a light-emitting device including an anode, a cathode, a light-emitting layer disposed between the anode and the cathode, a first electrode disposed at any one position of a position between the light-emitting layer and the anode and a position between the light-emitting layer and the cathode, and a first insulating film surrounding the first electrode in a cross-sectional view of the anode, the cathode, and the light-emitting layer.

A light-emitting device according to a third aspect of the disclosure includes an anode, a cathode, a light-emitting layer disposed between the anode and the cathode, an insulating portion in contact with a portion between the anode and the cathode, and a first electrode disposed at a position closer to the anode side or the cathode side than a virtual layer obtained by extending the light-emitting layer in a direction extending in an in-plane direction of both main surfaces of the light-emitting layer to be surrounded by the insulating portion.

DESCRIPTION OF EMBODIMENTS

Figure 1:
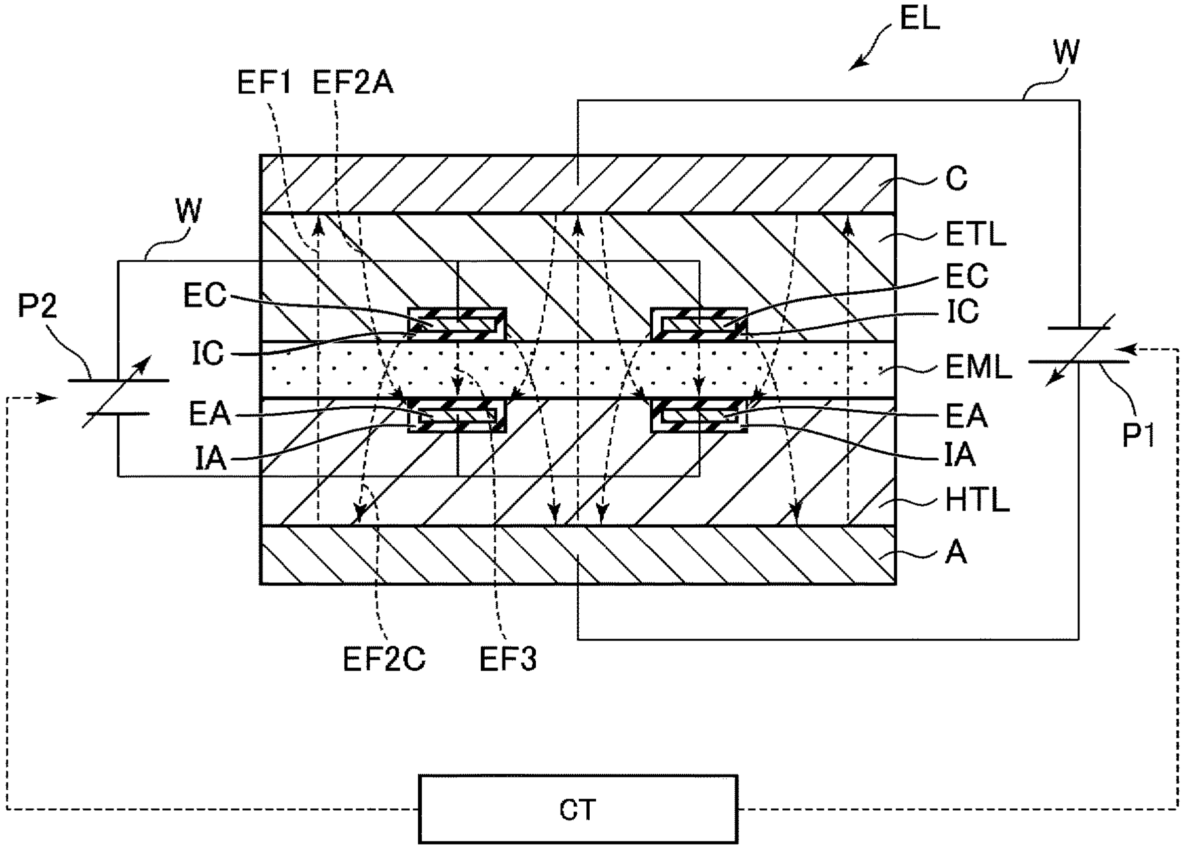
FIG. 1 is a schematic cross-sectional view of a light-emitting device according to a first embodiment.

Hereinafter, light-emitting devices according to embodiments of the disclosure will be described with reference to the drawings. Note that, in the drawings, the same or equivalent elements are denoted by the same reference numerals and signs, and redundant descriptions thereof will not be repeated.

First Embodiment

A light-emitting device EL according to a first embodiment will be described with reference to FIG. 1.

As illustrated in FIG. 1, the light-emitting device EL of the present embodiment includes an anode A, a hole transport layer HTL, a light-emitting layer EML, an electron transport layer ETL, and a cathode C. The anode A, the hole transport layer HTL, the light-emitting layer EML, the electron transport layer ETL, and the cathode C are layered in that order.

In the light-emitting device EL of the present embodiment, the light-emitting layer EML is a quantum dot light emitting diode (QLED) including quantum dots. Note that a quantum dot (QD) is a dot having a maximum width of 1 nm or more and 100 nm or less. The shape of the quantum dot may be any shape and is not particularly limited as long as it is within a range satisfying the maximum width, and the shape is not limited to a spherical three-dimensional shape (circular cross-sectional shape). The shape of the quantum dot may be, for example, a polygonal cross-sectional shape, a rod-shaped three-dimensional shape, a branch-shaped three-dimensional shape, or a three-dimensional shape having unevenness on the surface, or a combination thereof. However, the light-emitting layer EML may have a light emission mechanism involving excitons, such as an organic light emitting diode (OLED).

The light-emitting layer EML is disposed between the anode A and the cathode C. The light-emitting layer EML includes quantum dots each having a core and a shell covering the surface of the core. The light-emitting layer EML receives positive holes from the hole transport layer HTL and receives electrons from the electron transport layer ETL. Thereby, positive holes and electrons are radiatively recombined in the core of the quantum dot in the light-emitting layer EML. As a result, the quantum dots in the light-emitting layer EML emit light.

The hole transport layer HTL is disposed between the anode A and the light-emitting layer EML. The hole transport layer HTL transports positive holes from the anode A to the light-emitting layer EML. Although the anode A and the hole transport layer HTL are in direct contact with each other in the present embodiment, a hole injection layer (not illustrated) may be inserted between the anode A and the hole transport layer HTL.

The electron transport layer ETL is disposed between the cathode C and the light-emitting layer EML. The electron transport layer ETL transports electrons from the cathode C to the light-emitting layer EML. Although the cathode C and the electron transport layer ETL are in direct contact with each other in the present embodiment, an electron injection layer (not illustrated) may be inserted between the cathode C and the electron transport layer ETL.

As illustrated in FIG. 1, the light-emitting device EL includes a first electrode EA and a second electrode EC in addition to the anode A and the cathode C. The first electrode EA is disposed between the light-emitting layer EML and the anode A. The second electrode EC is disposed between the light-emitting layer EML and the cathode C.

The anode A and the cathode C cooperate with each other to generate a first electric field EF1 for causing the light-emitting layer EML to emit light between the anode A and the cathode C. On the other hand, the first electrode EA and the second electrode EC, which are features of the disclosure, generate a third electric field EF3 having a component in a direction opposite to that of the first electric field between the first electrode EA and the second electrode EC. Further, the first electrode EA cooperates with the cathode C to generate a second electric field EF2A having a component in a direction opposite to that of the first electric field EF1 in the light-emitting layer EML between the first electrode EA and the cathode C. In addition, the second electrode EC cooperates with the anode A to generate another second electric field EF2C having a component in a direction opposite to that of the first electric field EF1 in the light-emitting layer EML between the second electrode EC and the anode A.

Note that, in a state where no voltage is applied between the anode A and the cathode C, an initial electric field may be naturally generated in the light-emitting layer EML. Further, this initial electric field may be larger than the first electric field EF1, and the direction of the initial electric field may be opposite to the direction of the first electric field EF1. In this case, for example, the directions of the first electric field EF1, the second electric field EF2A, the other second electric field EF2C, and the third electric field EF3 may be the same. In other words, the direction of each of the first electric field EF1, the second electric field EF2A, the other second electric field EF2C, and the third electric field EF3 may be any direction as long as the total electric field generated in the light-emitting layer EML can be made close to zero.

In addition, when the light-emitting layer EML is a layer including quantum dots (QD) with a ligand, the following can be said. In this case, the electric field generated in the QD itself is most preferably zero in order to improve the luminous efficiency of the light-emitting device EL. Under this condition, QDs may have ligands. In this case, it is optimum that the electric field generated in the light-emitting layer EML have a constant value other than 0 that is close to zero, for example, a constant value in the same direction as the direction of the first electric field EF1, in order to improve the luminous efficiency of the light-emitting device EL. The reason for this is that, since a constant electric field is generated in the ligand, when the electric field generated in the QD is made close to zero, the total electric field generated in the light-emitting layer EML has a constant value other than 0 that is close to zero. Thus, in this specification, when the light-emitting layer EML is a layer including QDs with ligands, bringing the total electric field generated in the light-emitting layer EML close to zero includes generating an electric field having a constant value other than 0 that is close to zero in the light-emitting layer EML.

In the present embodiment, the first electrode EA is provided between the light-emitting layer EML and the anode A, and the second electrode EC is provided between the light-emitting layer EML and the cathode C. For this reason, as compared to a case where only one of the first electrode EA and the second electrode EC is provided, the first electric field EF1 can be canceled using the second electric field EF2A and the other second electric field EF2C in addition to the third electric field EF3. As a result, it is possible to reduce power consumed by a second power supply P2 in order to generate an electric field necessary for canceling the first electric field EF1 generated in the light-emitting layer EML by the first power supply P1.

Note that each of the second electric field EF2A and the second electric field EF2C is an electric field that acts in a direction in which injection of carriers into the light-emitting layer EML is inhibited. However, when an internal electric field generated in the light-emitting layer EML can be made close to zero, an effect of improving the internal quantum efficiency of the light-emitting layer EML is larger than an adverse effect of inhibiting injection of carriers into the light-emitting layer EML. As a result, external quantum efficiency (EQE) of the light-emitting layer EML can be improved.

In addition, a distance between the first electrode EA and the second electrode EC can be made considerably shorter than each of a distance between the first electrode EA and the cathode C and a distance between the second electrode EC and the anode A. For this reason, it is possible to further reduce power consumed by the second power supply P12 in order to generate an electric field necessary for canceling the first electric field EF1 generated in the light-emitting layer EML by the first power supply P1.

In addition, the second power supply P2 may not necessarily be set so that the third electric field EF3 having a component in a direction opposite to that of the first electric field EF1 is generated between the first electrode EA and the second electrode EC. That is, it is only required that the total electric field generated in the light-emitting layer EML be able to be made closer to zero by providing the first electrode EA and the second electrode EC, compared to a case where only the first electric field EF1 is provided. For example, even when the first electric field EF1 and the third electric field EF3 are in the same direction, when the third electric field EF3 is sufficiently smaller than the first electric field EF1, it is considered that an electric field generated in the light-emitting layer EML in at least a portion sandwiched between the first electrode EA and the second electrode EC can be made closer to zero than when only the first electric field EF1 is provided, and thus it is considered that the effects of the disclosure are exhibited.

The first electrode EA is insulated from the light-emitting layer EML, the anode A, and the cathode C. Specifically, the first electrode EA is surrounded by a first insulating film IA in a cross-sectional view of the light-emitting layer EML, the anode A, and the cathode C in FIG. 1. The first electrode EA and the first insulating film IA are provided in the hole transport layer HTL so that the first insulating film IA is in contact with the light-emitting layer EML. However, the first insulating film IA and the light-emitting layer EML may be provided with a predetermined distance therebetween. Note that the first insulating film IA does not need to have a film shape and may be an insulating portion.

In this specification, in any case, a "crossing cross-section" does not necessarily mean all possible cross-sections. For example, the "crossing cross-section" in the "cross-sectional view of the light-emitting layer EML, the anode A, and the cathode C" means at least one cross-section. When at least one cross-section is observed, it is sufficient that a condition that "the first electrode EA is surrounded by the first insulating film IA" be satisfied. In other words, the above-mentioned "crossing cross-section" does not need to be a plurality of cross-sections. In all cases in this specification, a notion of "crossing cross-section" is applied unless otherwise indicated.

In more detail, the "crossing cross-section" preferably means all possible cross-sections. For example, in the "crossing cross-section" in "a cross-sectional view of the light-emitting layer EML, the anode A, and the cathode C", it is preferable to mean all possible cross-sections. It is preferable that a condition that "the first electrode EA is surrounded by the first insulating film IA" be satisfied in all the possible cross-sections. However, since it is substantially impossible to observe all cross-sections that can be taken in an actual object, it is appropriate to consider that the condition that "the first electrode EA is surrounded by the first insulating film IA" is satisfied when at least one cross-section is observed as a preferable mode. In other words, the above-mentioned "crossing cross-section" does not need to be a plurality of cross-sections, and may be at least one cross-section. In all cases in this specification, a notion of "crossing cross-section" is also applied unless otherwise indicated.

The second electrode EC is insulated from the light-emitting layer EML, the cathode C, and the anode A. Specifically, the second electrode EC is surrounded by the second insulating film IC in a cross-sectional view of the light-emitting layer EML, the anode A, and the cathode in FIG. 1. The second electrode EC and the second insulating film IC are provided in the electron transport layer ETL so that the second insulating film IC is in contact with the light-emitting layer EML. However, the second insulating film IC and the light-emitting layer EML may be provided with a predetermined distance therebetween. Note that the second insulating film IC does not need to have a film shape and may be an insulating portion. The second insulating film IC is provided separately from the first insulating film IA.

Each of the first insulating film IA and the second insulating film IC may be made of an inorganic material. As the inorganic material forming the first insulating film IA or the second insulating film IC, for example, $SiO_2$, diamond, insulating DLC, a ceramic material, $Al_2O_3$, or the like can be used. In addition, each of the first insulating film IA and the second insulating film IC may be made of an organic material. Examples of the organic material forming the first insulating film IA or the second insulating film IC include polyimide, polyethylene, polypropylene, a vinyl chloride resin, an epoxy-based resin, polyester, a melamine resin, a urea resin, silicone, polycarbonate, and the like. The resistivity of the first insulating film IA or the second insulating film IC may be $10^{10}$ Ω/cm or more.

The light-emitting device EL includes the first power supply P1 and the second power supply P2 that generate power by power supplied from an external power supply of the light-emitting device EL. Each of the first power supply P1 and the second power supply P2 is a DC power supply that outputs a variable voltage. However, each of the first power supply P1 and the second power supply P2 may be a DC power supply that outputs a constant voltage. A voltage applied to the light-emitting layer EML by at least one of the first power supply P1 and the second power supply P2 may actually be a voltage applied by turn-on/turn-off of a transistor circuit.

In practice, the second power supply P2 may be constituted not only by a simple DC or AC voltage source but also by an electronic circuit that applies a portion of the voltage applied by the first power supply P1. More specifically, at least one of the first power supply P1 and the second power supply P2 may be constituted by a transistor circuit or the like that applies a voltage to each pixel of a display device. That is, the first power supply P1 or the second power supply P2 may be constituted by an electronic circuit electrically connected to the first electrode EA, the second electrode EC, the anode A, and the cathode C so that a portion of the voltage applied between the anode A and the cathode C is applied between the first electrode EA and the second electrode. In this case, the first power supply P1 or the second power supply P2 is constituted by an electronic circuit electrically connected to the first electrode EA, the second electrode EC, the anode A, and the cathode C so that an electric field in a direction opposite to an electric field applied between the anode A and the cathode C is generated between the first electrode EA and the second electrode EC.

The light-emitting device EL includes an electric circuit W. The electric circuit W includes the first power supply P1 and the second power supply P2. The first power supply P1 is electrically connected to the anode A and the cathode C. Thereby, the first power supply P1 generates the first electric field EF1 between the anode A and the cathode C. The second power supply P2 is electrically connected to the first electrode EA and the second electrode EC. Thereby, the second power supply P2 generates the second electric field EF2A between the cathode C and the first electrode EA, generates another second electric field between the anode A and the second electrode EC, and generates the third electric field EF3 between the first electrode EA and the second electrode EC. Accordingly, it is possible to generate the second electric field EF2A having a component in a direction opposite to the first electric field EF1, the other second electric field EF2C, and the third electric field EF3 by the electric circuit W regardless of the control of the control unit CT to be described later.

According to the light-emitting device EL of the present embodiment, the first power supply P1 applies a voltage between the anode A and the cathode C under the control of the control unit CT. At this time, the second power supply P2 applies a voltage between the first electrode EA and the second electrode EC under the control of the control unit CT. Thereby, the second electric field EF2A that cancels at least a portion of the first electric field EF1, the other second electric field EF2C, and the third electric field EF3 are generated.

For this reason, it is possible to reduce the inclination of a band gap of the core in the quantum dot in the light-emitting layer EML which is caused by the application of a voltage between the anode A and the cathode C. Thereby, it is possible to increase an overlap integral of wave functions when a voltage is applied between the anode A and the cathode C. As a result, it is possible to improve the internal quantum efficiency of the light-emitting layer EML. Thus, the luminous efficiency of the light-emitting device EL can be improved.

As illustrated in FIG. 1, both the first electrode EA and the second electrode EC are provided in the light-emitting device EL of the present embodiment. However, even when only one of the first electrode EA and the second electrode EC is provided, the above-described effect of improving the luminous efficiency of the light-emitting device EL can be obtained. Note that, in the light-emitting device EL, when both the first electrode EA and the second electrode EC are provided, luminous efficiency can be more effectively improved than when only one of the first electrode EA and the second electrode EC is provided.

The thickness of each of the first insulating film IA and the second insulating film IC is preferably 5 nm or more. In this case, it is possible to prevent or suppress the generation of a tunneling current in the first insulating film IA or the second insulating film IC. For this reason, it is possible to prevent a current from flowing from the first electrode EA or the second electrode EC to the light-emitting layer EML. However, the thickness of each of the first insulating film IA and the second insulating film IC may be any value as long as the generation of a tunneling current can be prevented or suppressed.

As illustrated in FIG. 1, in the present embodiment, the first electrode EA and the second electrode EC are disposed facing each other in a state where the light-emitting layer EML is present between the first electrode EA and the second electrode EC. For this reason, a distance between the first electrode EA and the second electrode EC is smaller than of a case where the first electrode EA and the second electrode EC are disposed shifted from a position where they face each other. Note that it is assumed that the same voltage is applied between the first electrode EA and the second electrode EC in each of a first case where the first electrode EA and the second electrode EC are disposed at positions facing each other and a second case where the first electrode EA and the second electrode EC are disposed shifted from the positions facing each other. Under this condition, in the first case, for example, when the same voltage is applied between the first electrode EA and the second electrode EC, the second electric field EF2A, the other second electric field EF2C, and the third electric field EF3 for canceling at least a portion of the first electric field EF1 generated between the anode A and the cathode C can be made larger than in the second case. As a result, the luminous efficiency of the light-emitting device EL can be improved more efficiently.

Figure 2:
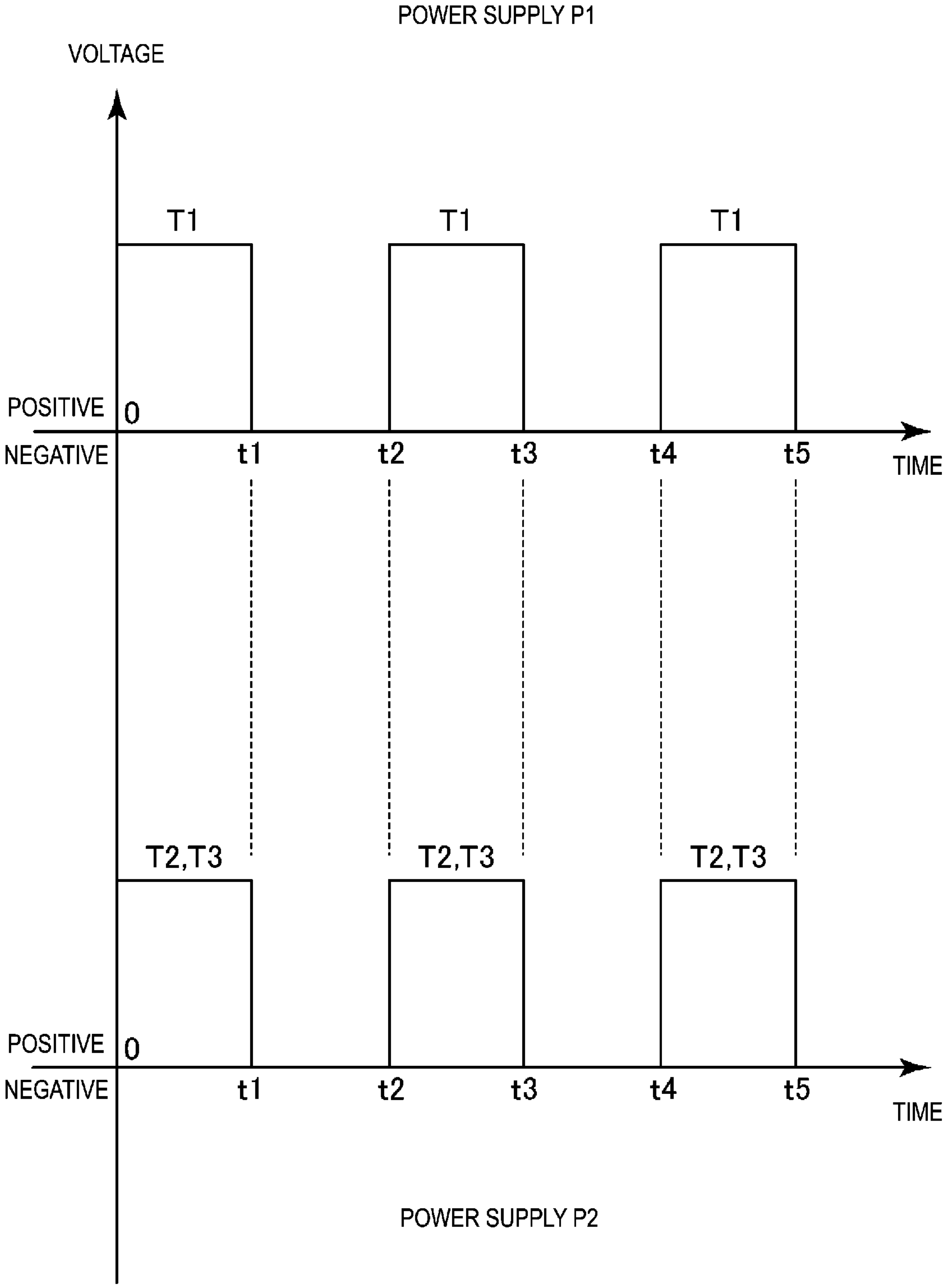
FIG. 2 is a timing chart illustrating control modes of a first power supply and a second power supply using a control unit of the light-emitting device according to the first embodiment.

As illustrated in FIG. 2, the light-emitting device EL includes the control unit CT. The control unit CT controls the first power supply P1 and the second power supply P2. According to this control, a first period T1 in which the first electric field EF1 is generated, a second period T2 in which the second electric field EF2A and the other second electric field EF2C are generated, and a third period T3 in which the third electric field EF3 is generated are synchronized with each other. Specifically, the control unit CT causes the first power supply P1 and the second power supply P2 to generate pulse waveforms so that the first period T1, the second period T2, and the third period T3 are synchronized with each other.

Thereby, each of the first electric field EF1, the second electric field EF2A, the other second electric field EF2C, and the third electric field EF3 is substantially constant in a period in which the light-emitting layer EML emits light. For this reason, the emission color of the light-emitting layer EML can be maintained substantially constant during the period in which the light-emitting layer EML emits light. This is because, when the magnitude of an electric field generated in the light-emitting layer EML changes, the wavelength of light emitted from the light-emitting layer EML changes, but when the magnitude of an electric field generated in the light-emitting layer EML does not change, the wavelength of light emitted from the light-emitting layer EML does not change.

In the light-emitting device EL of the present embodiment, as illustrated in FIG. 2, an ON period of the pulse waveform generated by the first power supply P1 and an ON period of the pulse waveform generated by the second power supply P2 completely match each other. However, the ON period of the pulse waveform generated by the first power supply P1 and the ON period of the pulse waveform generated by the second power supply P2 may not partially match each other. That is, it is sufficient that the ON period of the pulse waveform generated by the first power supply P1 and the ON period of the pulse waveform generated by the second power supply P2 at least partially match each other. This also makes it possible to generate the second electric field EF2A, the other second electric field EF2C, and the third electric field EF3 that cancel at least a portion of the first electric field EF1 in the light-emitting layer EML.

Figure 3:
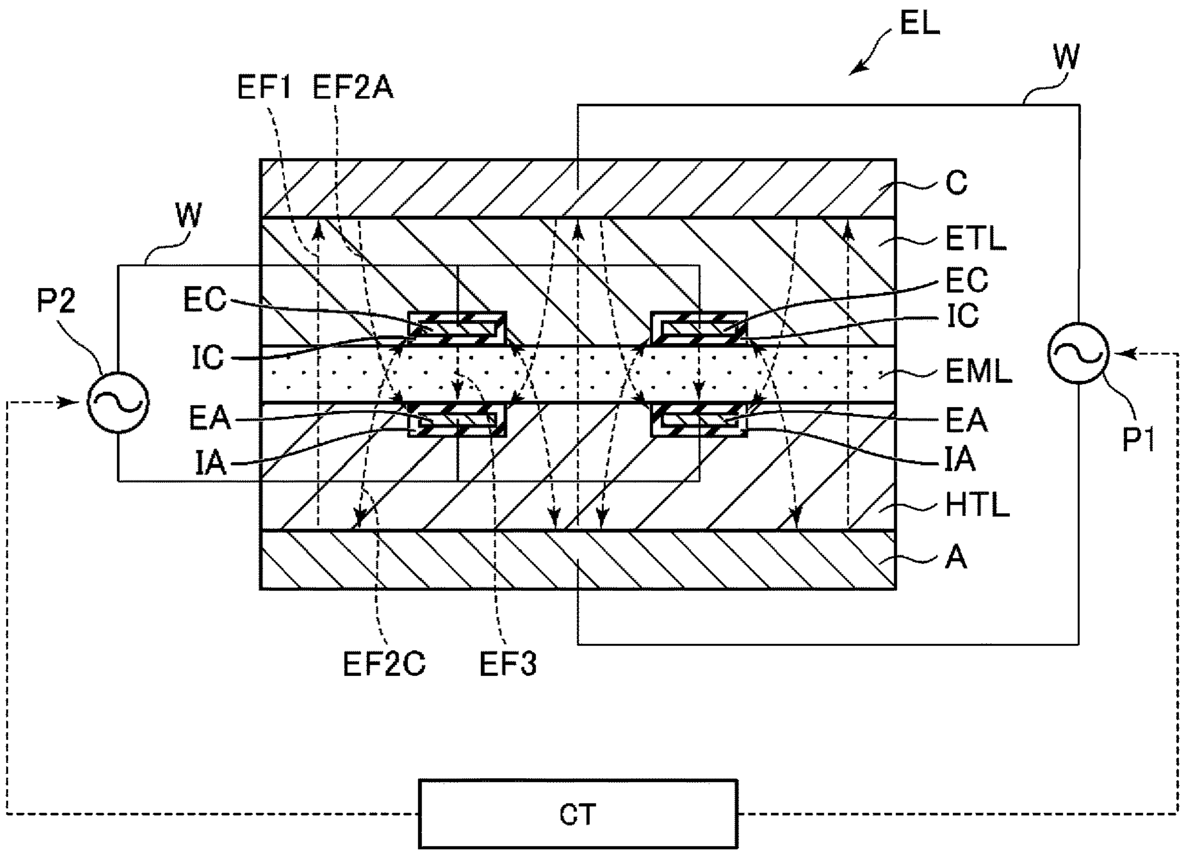
FIG. 3 is a schematic cross-sectional view of a light-emitting device according to a modified example of the first embodiment.

A light-emitting device EL according to a modified example of the first embodiment will be described with reference to FIG. 3. As illustrated in FIG. 3, the light-emitting device EL according to the modified example of the first embodiment is different from the light-emitting device EL according to the first embodiment illustrated in FIG. 1 only in that each of a first power supply P1 and a second power supply P2 is an AC power supply.

Figure 4:
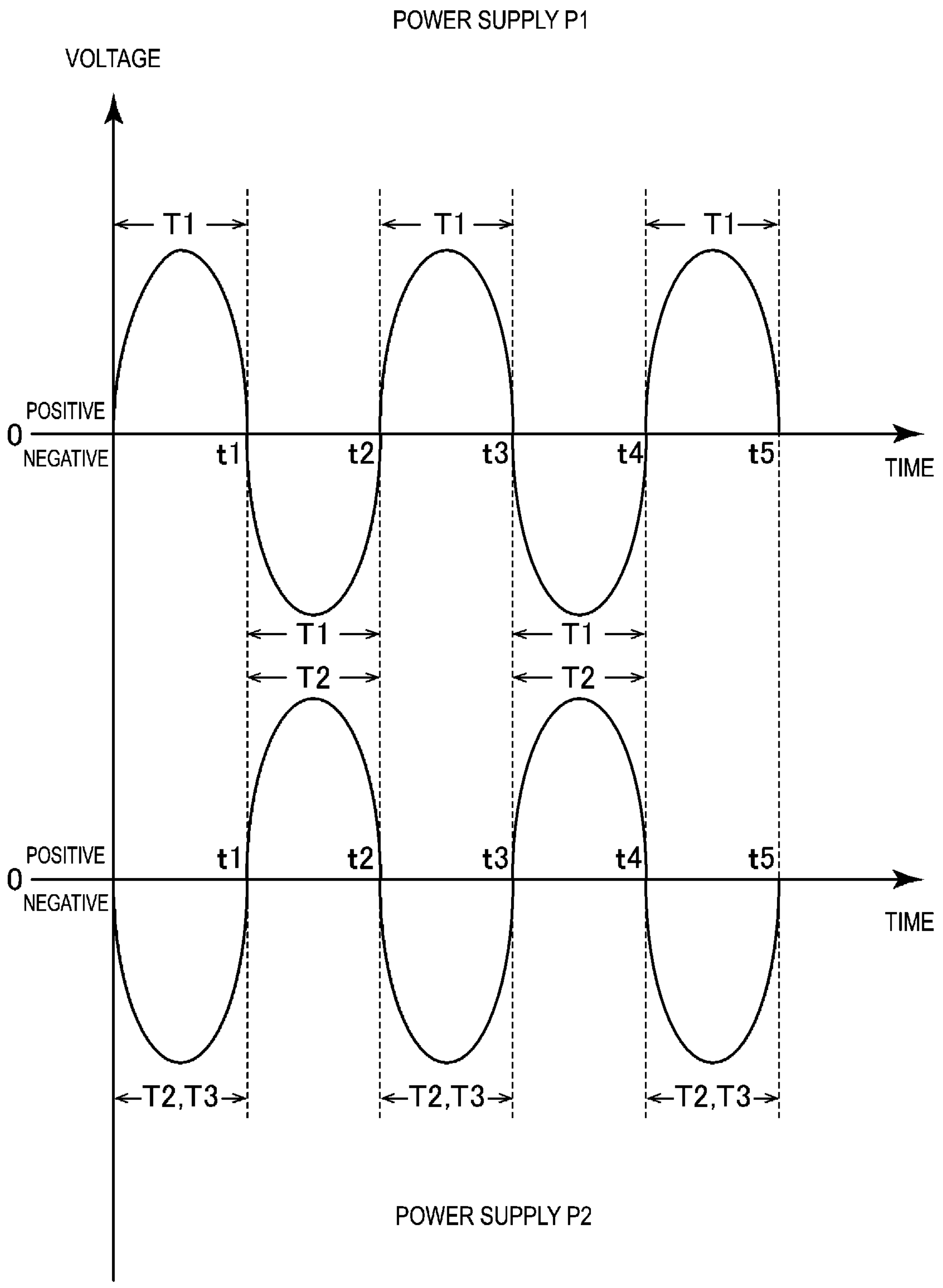
FIG. 4 is a timing chart illustrating control modes of a first power supply and a second power supply using a control unit of the light-emitting device according to the modified example of the first embodiment.

As illustrated in FIG. 4, a control unit CT of the light-emitting device EL according to the modified example of the first embodiment causes each of the first power supply P1 and the second power supply P2 to generate an AC waveform. More specifically, the control unit CT generates an AC waveform so that a first period T1 in which the first electric field EF1 is generated, a second period T2 in which a second electric field EF2A and the other second electric field EF2C are generated, and a third period T3 in which a third electric field EF3 is generated are synchronized with each other.

Thereby, each of the first electric field EF1, the second electric field EF2A, the other second electric field EF2C, and the third electric field EF3 is substantially constant in a period in which the light-emitting layer EML emits light. For this reason, for the reason described above, the emission color of the light-emitting layer EML can be maintained substantially constant during the period in which the light-emitting layer EML emits light.

Note that a first AC waveform generated by the first power supply P1 and a second AC waveform generated by the second power supply P2 have the same frequency, and positive and negative signs of the first AC waveform and positive and negative signs of the second AC waveform are opposite to each other in the same period. However, even when the frequency of the AC waveform generated by the first power supply P1 and the frequency of the AC waveform generated by the second power supply P2 are different from each other, it is possible to generate the second electric field EF2A, the other second electric field EF2C, and the third electric field EF3 that cancel at least a portion of the first electric field EF1.

The planar shape of each of the first electrode EA and the second electrode EC of the light-emitting device EL according to the present embodiment and the modified example thereof will be described with reference to FIG. 5.

Figure 5:
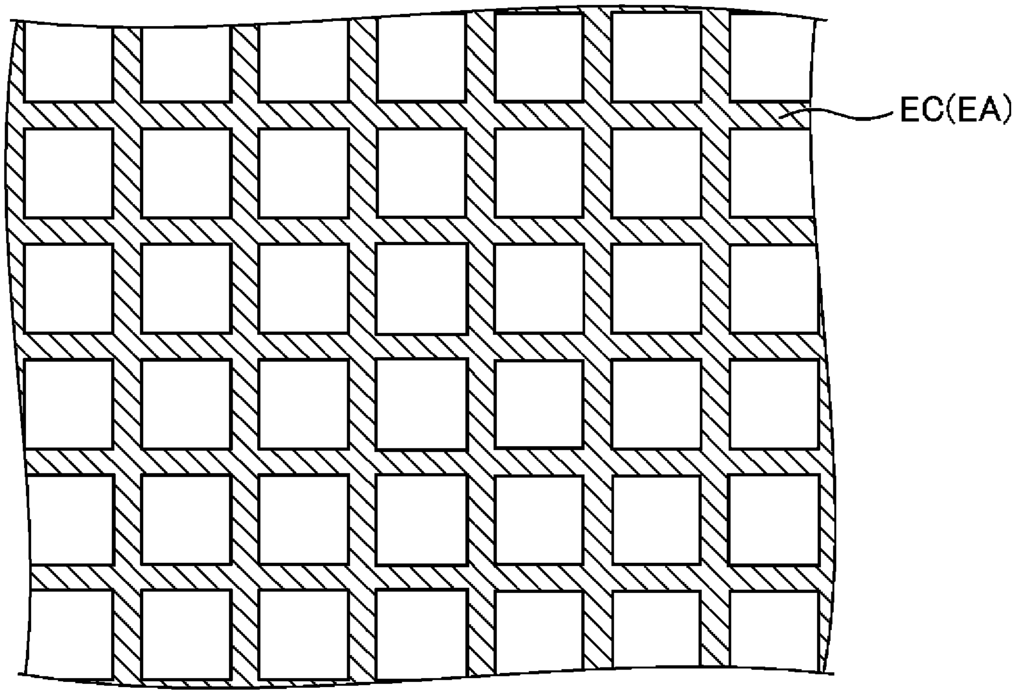
FIG. 5 is a plan view illustrating a state where a mesh-shaped first electrode and a mesh-shaped second electrode of the light-emitting device according to the first embodiment are disposed facing each other.
Figure 6:
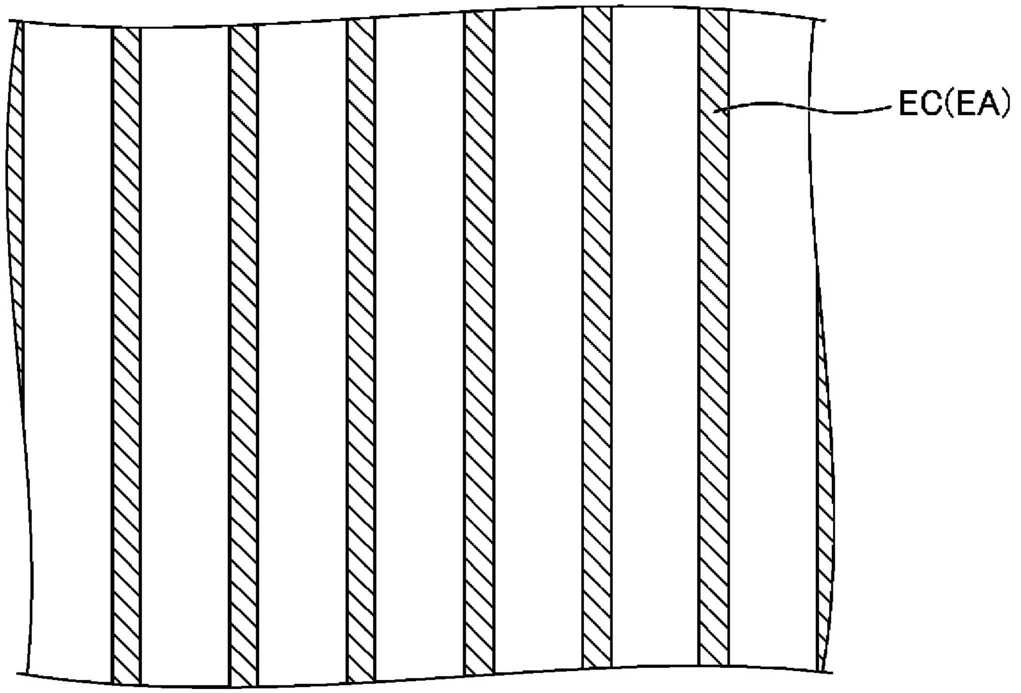
FIG. 6 is a plan view illustrating a state where a first line-and-space electrode and a second line-and-space electrode face each other according to a modified example of the light-emitting device according to the first embodiment.

As illustrated in FIG. 5, in the present embodiment, each of the first electrode EA and the second electrode EC has a mesh shape in a plan view. However, for example, as illustrated in FIG. 6, each of the first electrode EA and the second electrode EC may form a line-and-space pattern in a plan view, specifically, a plurality of linear patterns provided in parallel with each other at intervals.

However, the planar shape of the first electrode EA or the second electrode EC may be any shape as long as it is a shape having an opening through which positive holes or electrons can pass, such as a shape in which a plurality of holes are formed in a flat plate, a spiral shape, or a checkered pattern in which square holes and square electrode plates are alternately formed.

According to the planar shape of each of the first electrode EA and the second electrode EC according to such a modified example, a path through which positive holes can pass can be left between the light-emitting layer EML and an anode A, and a path through which electrons can pass can be left between the light-emitting layer EML and a cathode C. In addition, the second electric field EF2A, the other second electric field EF2C, and the third electric field EF3 for canceling at least a portion of the first electric field EF1 in the light-emitting layer EML can be generated in a wide range of the light-emitting layer EML.

Note that each of the first electrode EA and the second electrode EC of the present embodiment may have any planar shape as long as they face each other.

A change in a band gap of the light-emitting layer EML which is caused by applying a voltage to the first electrode EA and the second electrode EC will be described with reference to FIGS. 7 to 9.

When a voltage is applied between the anode A and the cathode C of the light-emitting device EL, a voltage is also applied to the light-emitting layer EML including quantum dots each having a core and a shell covering the surface of the core. At this time, since a band gap of the core constituting the quantum dot is inclined, electrons and positive holes are spatially separated as illustrated in FIG. 7.

As a result, an overlap integral of wave functions of the electrons and the positive holes is reduced, thereby reducing the probability of the electrons and the positive holes being recombined. For this reason, luminous efficiency is reduced. Thus, in the present embodiment, in order to cancel at least a portion of the first electric field EF1 generated in the light-emitting layer EML, a voltage is applied between the first electrode EA and the second electrode EC.

Specifically, based on experimental results, a voltage having a magnitude of approximately 10 meV to 20 meV is applied between the first electrode EA and the second electrode EC in a direction opposite to the direction of the voltage applied between the anode A and the cathode C. For this reason, at least a portion of the first electric field EF1 in the light-emitting layer EML is canceled by the second electric field EF2A, the other second electric field EF2C, and the third electric field EF3 applied between the first electrode EA and the second electrode EC.

Thus, an electric field generated in the light-emitting layer EML becomes close to zero. Thereby, the band gap of the light-emitting layer EML becomes flat. As a result, the light-emitting layer EML emits light in a state where no electric field is generated in at least a portion of the light-emitting layer EML. Thus, the luminous efficiency of the light-emitting layer EML is improved.

Figure 7:
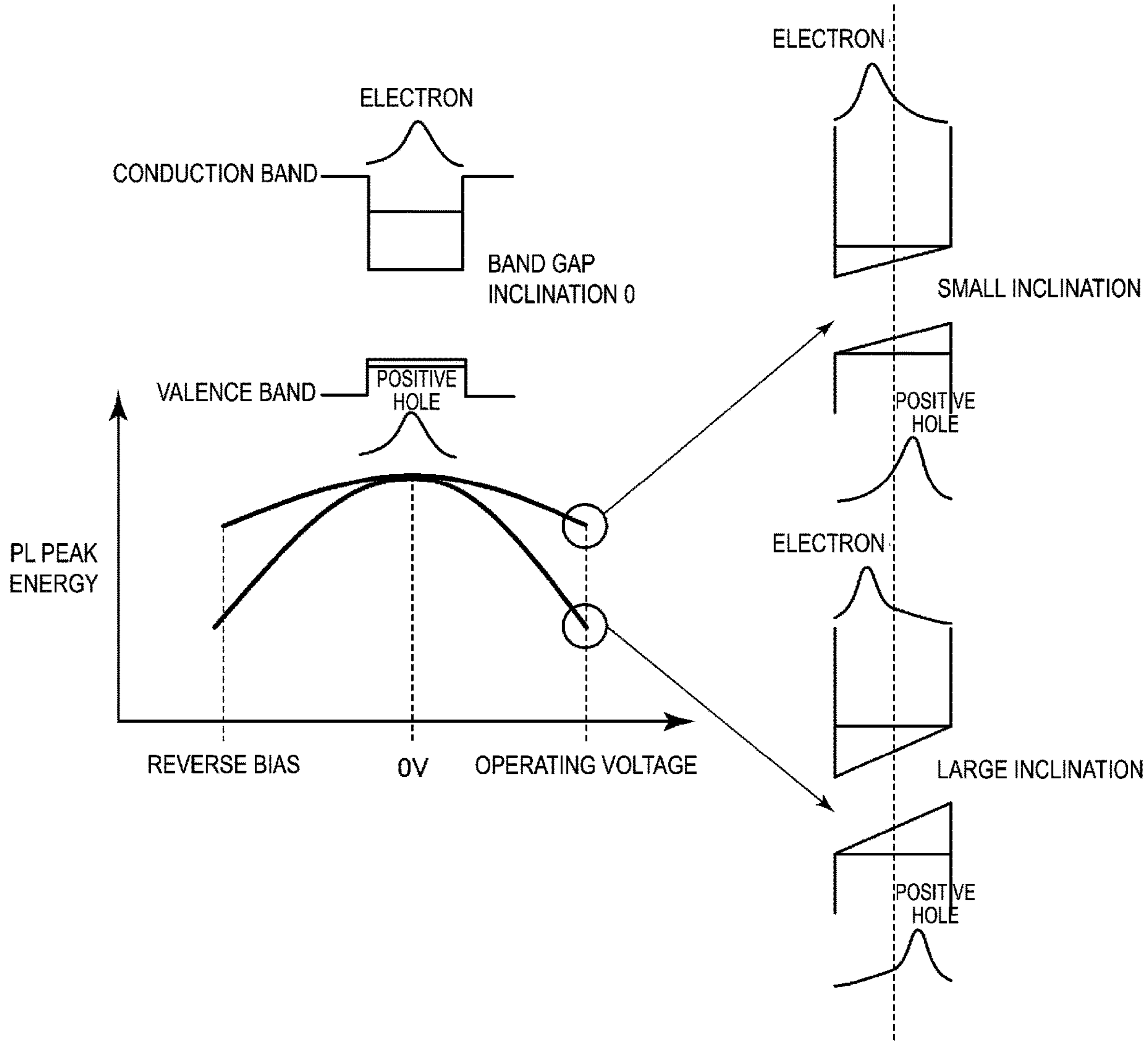
FIG. 7 is a diagram illustrating a shape of a band gap at each point of a graph showing a relationship between a voltage applied between an anode and a cathode of a light-emitting device according to a comparative example and photoluminescence (PL) peak energy.

As illustrated in FIG. 7, when an operating voltage is applied between the anode A and the cathode C in a case where the first electrode EA and the second electrode EC are not provided, the larger an absolute value of the operating voltage, the larger an inclination of the band gap. More specifically, when an operating voltage is 0 V, the band gap is flat. When the operating voltage is relatively low, the inclination of the band gap is relatively small. When the operating voltage is relatively large, the inclination of the band gap is relatively large. Note that a normal operating voltage is, for example, 3 V.

Figure 8:
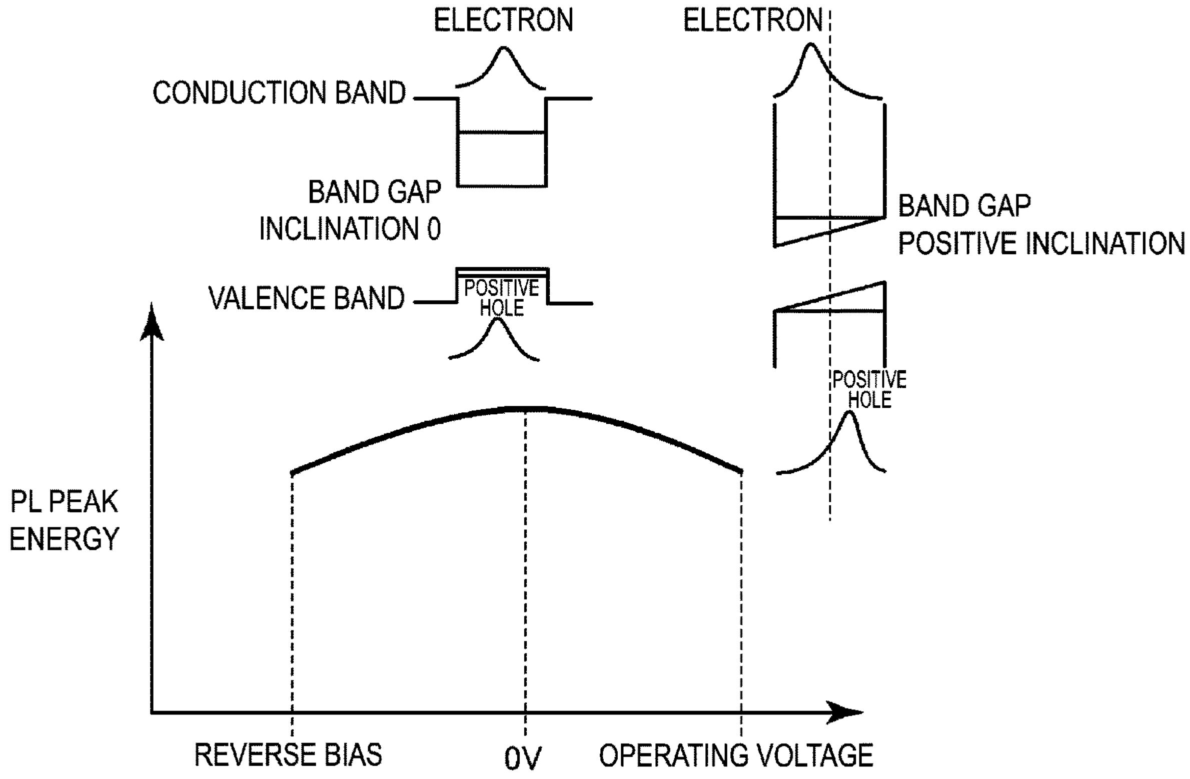
FIG. 8 is a diagram illustrating a band gap becoming flat when a voltage applied between the anode and the cathode of the light-emitting device according to the comparative example is 0.
Figure 9:
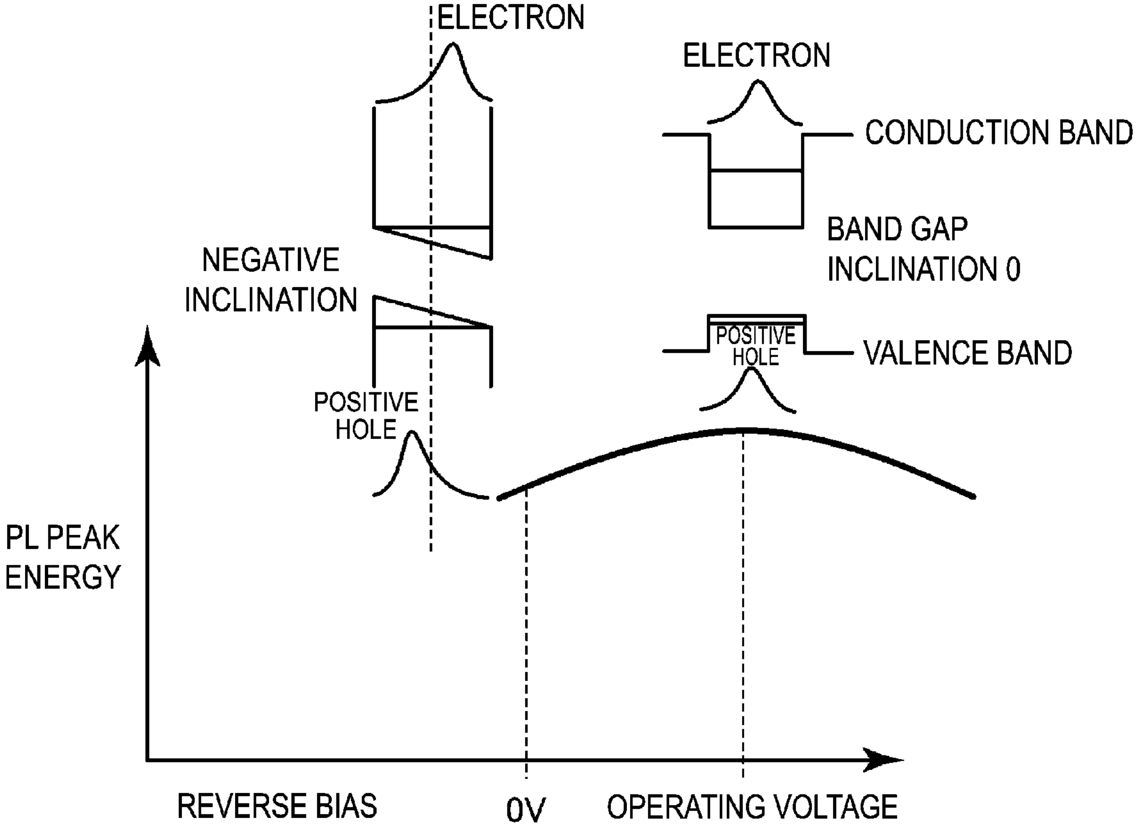
FIG. 9 is a diagram illustrating a band gap becoming flat when a voltage applied between an anode and a cathode of the light-emitting device according to the first embodiment is an operating voltage.

With reference to FIG. 8 and FIG. 9, an effect which is exhibited by applying a voltage, which generates an electric field in a direction opposite to that of the voltage applied between the anode A and the cathode C, to each of the first electrode EA and the second electrode EC will be discussed.

As can be seen from FIG. 8, when an operating voltage is applied between the anode A and the cathode C, the band gap of the light-emitting layer EML has a negative inclination unless a voltage is applied between the first electrode EA and the second electrode EC (0 V).

As can be seen from FIG. 9, even when the operating voltage is applied between the anode A and the cathode C, at least a portion of the first electric field EF1 generated in the light-emitting layer EML by the application of the operating voltage can be cancelled by applying a voltage between the first electrode EA and the second electrode EC. Thereby, an inclination of a band gap of the core of the quantum dot can be set to zero, that is, the band gap can be made flat. For this reason, as described above, an overlap integral of wave functions when a voltage is applied between the anode A and the cathode C can be increased. As a result, it is possible to improve the internal quantum efficiency of the light-emitting device EL. Thus, the luminous efficiency of the light-emitting device EL can be improved.

In addition, according to the light-emitting device EL of the above-described embodiment, the wavelength of light emitted from the light-emitting layer EML can be shortened. Thereby, the color of light emitted from the light-emitting layer EML can be slightly changed. For this reason, when the wavelength of the light emitted from the light-emitting layer EML is not a desired wavelength, the wavelength of the light emitted from the light-emitting layer EML is shortened to be the desired wavelength, whereby it is possible to perform adjustment for causing the light-emitting layer EML to emit light of a desired color. The adjustment is performed by increasing or decreasing a voltage to be applied between the first electrode EA and the second electrode EC.

A method of manufacturing the light-emitting device EL according to the first embodiment will be described with reference to FIGS. 10 to 17.

Hereinafter, as the method of manufacturing the light-emitting device EL, a method of manufacturing a QLED in which the anode A, the hole transport layer HTL, the light-emitting layer EML, the electron transport layer ETL, and the cathode C are layered in this order from bottom to top will be described.

Figure 10:
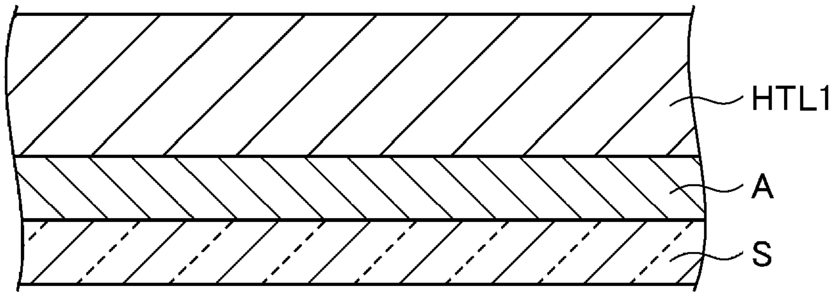
FIG. 10 is a schematic first cross-sectional view illustrating a method of manufacturing the light-emitting device according to the first embodiment.

First, as illustrated in FIG. 10, the anode A is formed on a transparent substrate S made of $SiO_2$ or the like. In the present embodiment, the anode A is constituted by a transparent electrode film such as indium tin oxide (ITO). For this reason, in the present embodiment, the anode A functions as an electrode on a side where light emitted from the light-emitting layer EML is extracted from the light-emitting device EL. However, the anode A may be constituted by an opaque electrode film such as a metal film, and may function as an electrode that reflects light toward the cathode C. The film thickness of the anode A is in the order of several tens of nm to several hundreds of nm.

Next, as illustrated in FIG. 10, a hole transport layer HTL1 made of a transparent material is formed on the anode A. Although the hole transport layer HTL1 is formed of an organic material in the present embodiment, it may be formed of an inorganic film.

When the hole transport layer HTL1 is formed of an organic material, a general material can be used. In this case, for example, the organic material may be poly[(9,9-dioctylfluorenyl-2,7-diyl)-co-(4,4'-(N-(4-sec-butylphenyl) diphenylamine))] (TFB). In addition, the organic material may be polyvinylcarbazole (PVK). Further, the organic material may be poly[N,N'-bis(4-butylphenyl)-N,N'-bis (phenyl)-benzi] (p-TPD). In addition, the organic material may be N4,N4'-bis(4-(6-((3-ethyloxetan-3-yl)methoxy) hexyl)phenyl)-N4,N4'-diphenyl-4[1,1'-biphenyl]-4,4'-diamine (OTPD).

On the other hand, when the hole transport layer HTL1 is formed of an inorganic film, the inorganic film may be, for example, a metal oxide film capable of controlling conductivity to a p-type such as NiO, may be a nitride semiconductor or a III-V compound, or may be a II-VI compound. As a method of forming the hole transport layer HTL1, a coating method, a sputter deposition method, or the like can be used. The film thickness of the hole transport layer HTL1 is in the order of several tens of nm.

Thereafter, an insulating film (not illustrated) is deposited on the hole transport layer HTL1 by sputtering or is formed by applying nanoparticles. The composition of the insulating film may be $SiO_2$ or the like. A first photoresist film (not illustrated) is coated on the insulating film mentioned above. The first photoresist film is processed into a photomask having a plurality of openings processed into a mesh shape in a plan view by exposure and development.

Note that the first photoresist film described above is a negative type. For this reason, an opening portion of the first photoresist film is cured by exposure. Thereafter, during development, portions of the first photoresist film other than the portions cured by exposure are removed.

Figure 11:
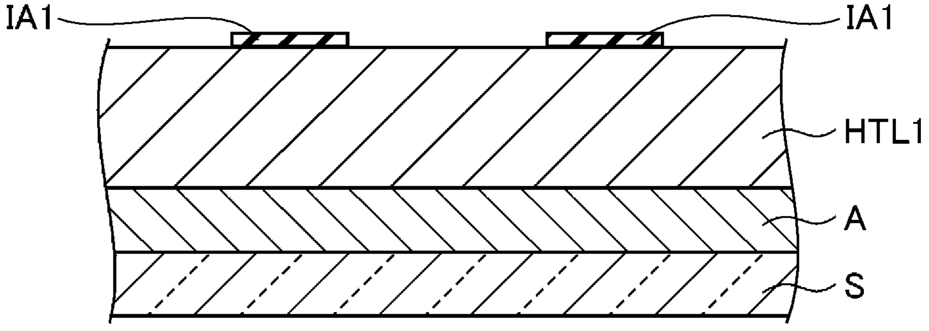
FIG. 11 is a schematic second cross-sectional view illustrating a method of manufacturing the light-emitting device according to the first embodiment.

Thereafter, the above-described insulating film is etched using a photomask having a plurality of openings processed into a mesh shape in a plan view. Thereby, as illustrated in FIG. 11, an insulating film IA1 is formed on the hole transport layer HTL1. As the etching, any etching method such as wet etching or dry etching may be used. Thereafter, resist remaining on the insulating film IA1 is removed (ashing) with an organic solution (acetone or the like). Thereby, a structure illustrated in FIG. 11 is obtained.

Next, a second photoresist film (not illustrated) is formed to cover the insulating film IA1 formed into a mesh shape. An opening is formed in the second photoresist film by a photolithography technique only in a portion of the second photoresist film where the first electrode EA is to be formed. Thereafter, a conductive film such as Al is vapor-deposited on the second photoresist film to cover the second photoresist including the opening.

Figure 12:
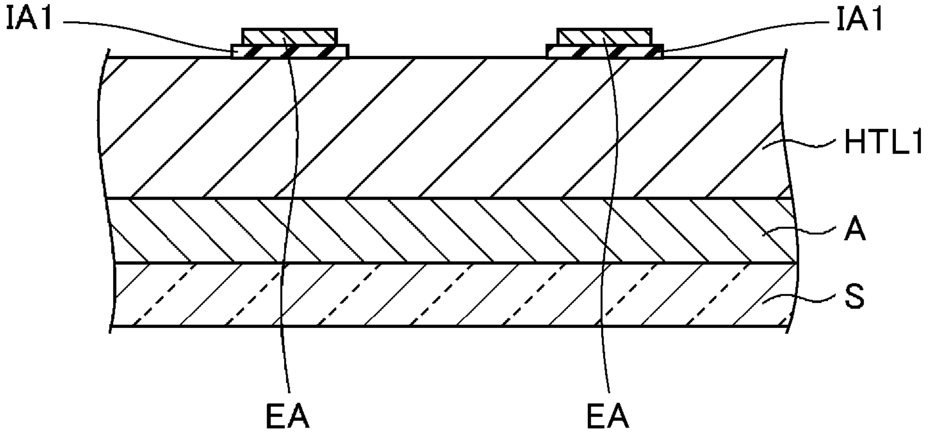
FIG. 12 is a schematic third cross-sectional view illustrating a method of manufacturing the light-emitting device according to the first embodiment.

Next, the second photoresist film is removed by lift-off. As a result, as illustrated in FIG. 12, the first electrode EA made of Al and having a mesh shape in a plan view is formed on the insulating film IA1 having a mesh shape in a plan view. Here, the first electrode EA is formed of an opaque metal material, but may be formed of a transparent material such as ITO.

Figure 13:
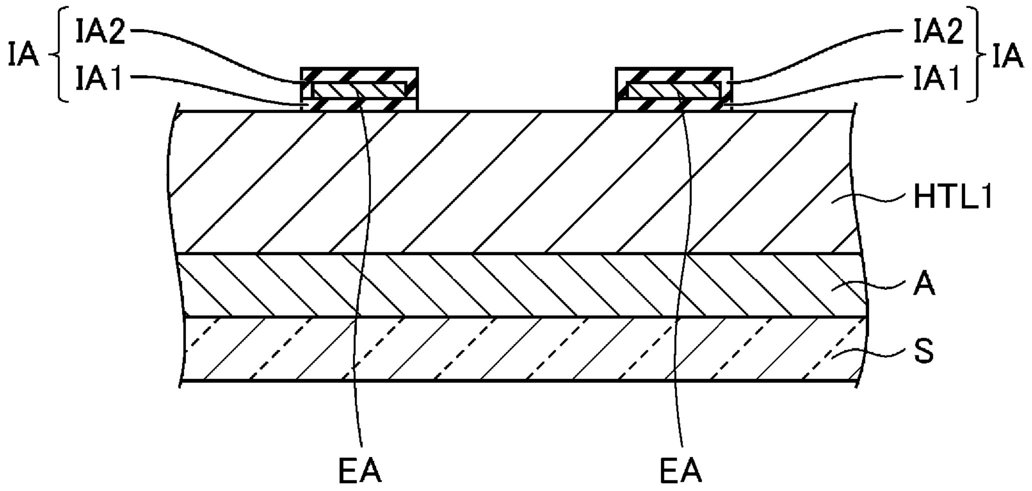
FIG. 13 is a schematic fourth cross-sectional view illustrating a method of manufacturing the light-emitting device according to the first embodiment.

Next, as illustrated in FIG. 13, an insulating film IA2 is formed to cover the first electrode EA having a mesh shape in a plan view and to be integrated with the insulating film IA1. Similarly to the insulating film IA1, the insulating film IA2 also has a mesh shape in a plan view. The insulating film IA2 is formed of the same material as the insulating film IA1, for example, $SiO_2$, which is a transparent material. Thereby, the insulating film IA1 and the insulating film IA2 are integrated with each other. As a result, the first insulating film IA covering the first electrode EA in a cross-sectional view is formed.

The widths of line portions constituting the mesh-shaped first electrode EA and a distance between the line portions in a plan view are 1 μm, and the thickness of the first electrode EA is 20 nm. The coating thickness of the first insulating film IA is 10 nm.

Figure 14:
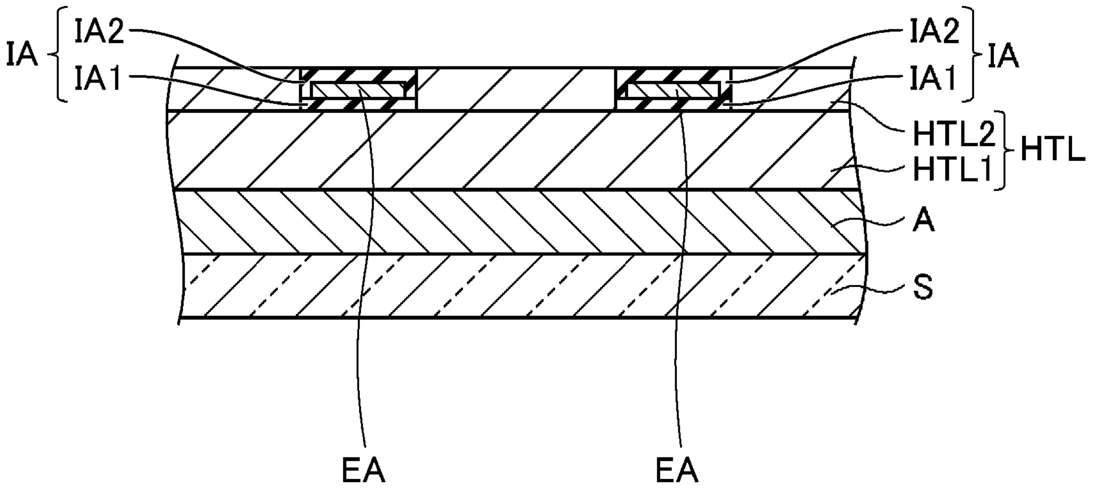
FIG. 14 is a schematic fifth cross-sectional view illustrating a method of manufacturing the light-emitting device according to the first embodiment.

Next, a hole transport layer HTL2 is formed to cover the first electrode EA and the first insulating film IA. Thereafter, the upper surface of the first insulating film IA is exposed by chemical mechanical polishing (CMP). Thereby, a structure illustrated in FIG. 14 is formed. However, the light-emitting layer EML may be formed to cover the first electrode EA and the first insulating film IA without forming the hole transport layer HTL2. In addition, the hole transport layer HTL2 may be deposited on the hole transport layer HTL1 by adjusting an execution time of chemical vapor deposition (CVD) to cover only the side surface of the first insulating film IA.

Figure 15:
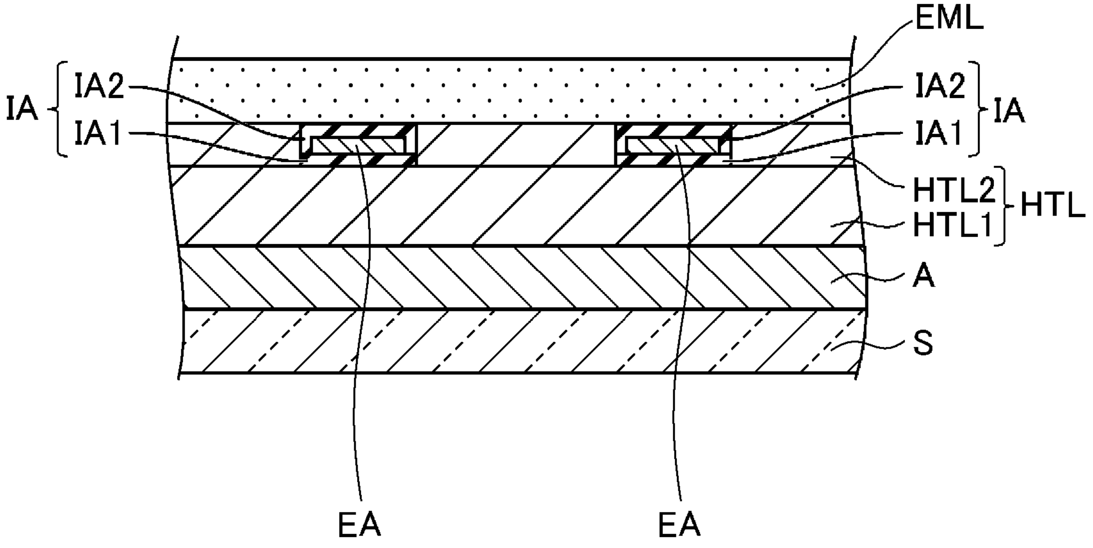
FIG. 15 is a schematic sixth cross-sectional view illustrating a method of manufacturing the light-emitting device according to the first embodiment.

Next, a quantum dot (QD) solution dispersed in a solvent is spin-coated on the upper surface of the hole transport layer HTL and the upper surface of the first insulating film IA. Thereafter, the QD solution coated on the upper surface of the hole transport layer HTL and the upper surface of the first insulating film IA is baked. Thereby, a solvent is evaporated from the solution containing QDs. As a result, as illustrated in FIG. 15, the light-emitting layer EML containing QDs is formed to cover the upper surface of the hole transport layer HTL and the upper surface of the first insulating film IA.

Figure 16:
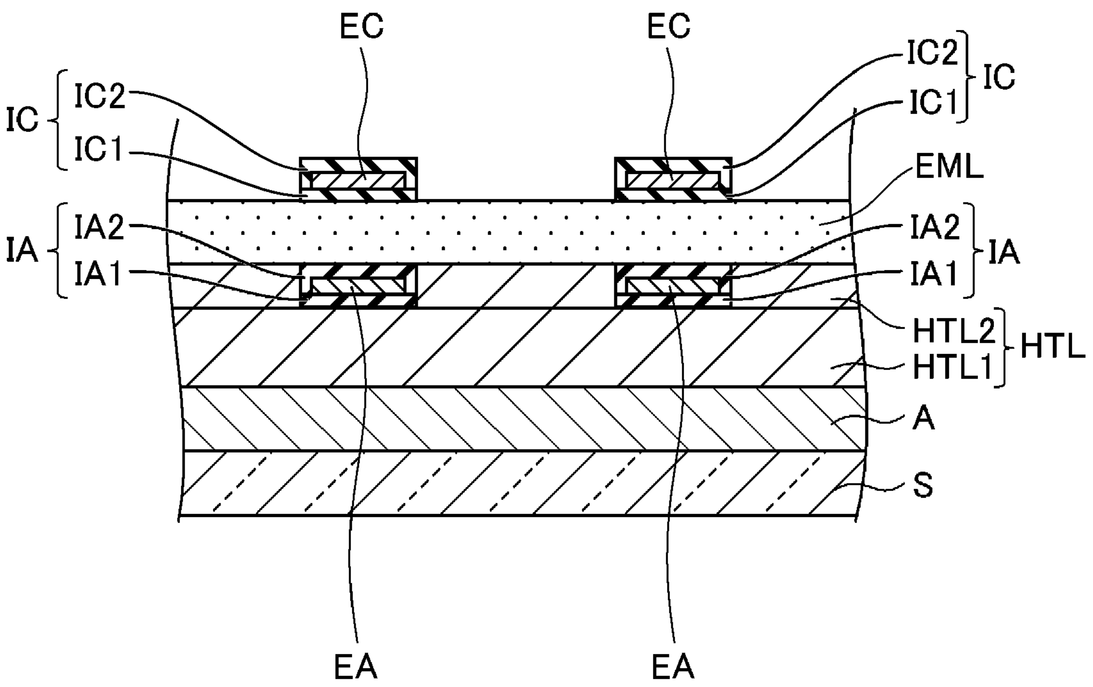
FIG. 16 is a schematic seventh cross-sectional view illustrating a method of manufacturing the light-emitting device according to the first embodiment.
Figure 17:
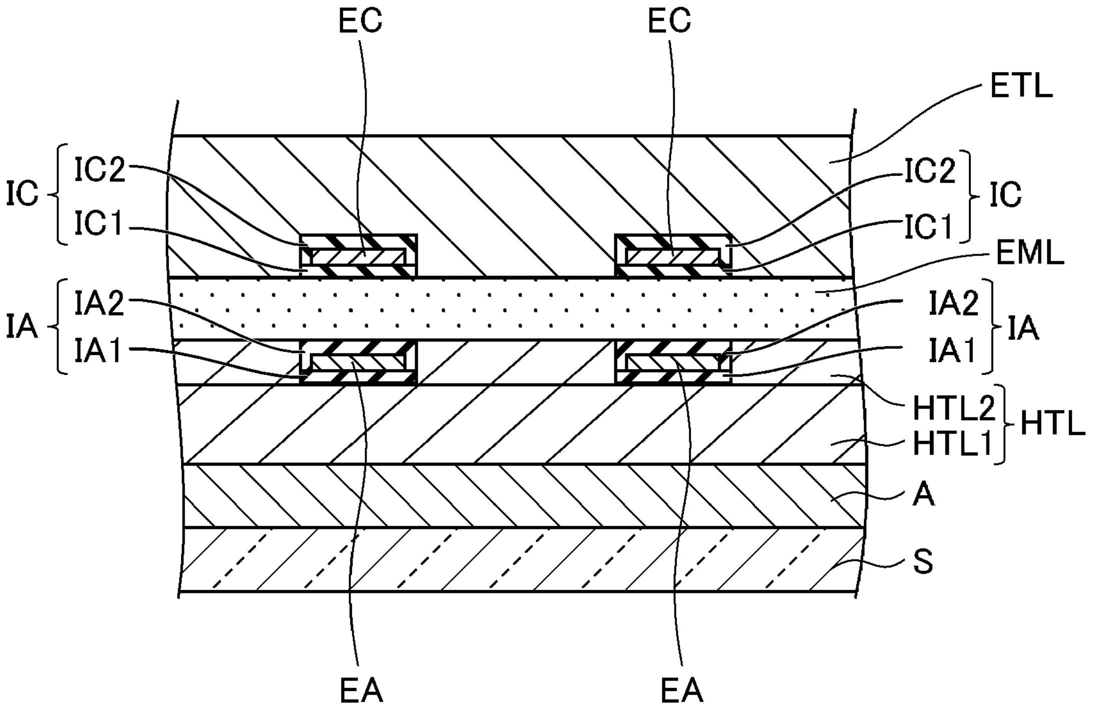
FIG. 17 is a schematic eighth cross-sectional view illustrating a method of manufacturing the light-emitting device according to the first embodiment.

Next, as illustrated in FIG. 16, the second electrode EC and the second insulating film IC are formed on the light-emitting layer EML by the same manufacturing method as that for the first electrode EA and the first insulating film IA. The second insulating film IC includes an insulating film IC1 and an insulating film IC2. In a plan view, the second electrode EC and the second insulating film IC have the same shapes as those of the first electrode EA and the first insulating film IA, respectively, and overlap the first electrode EA and the first insulating film IA.

Thereafter, the electron transport layer ETL is formed to cover the light-emitting layer EML and the second insulating film IC. The electron transport layer ETL is formed by spin-coating ZnO nanoparticles or the like on the light-emitting layer EML and the second insulating film IC, baking the ZnO nanoparticles or the like coated on the light-emitting layer EML and the second insulating film IC, and evaporating the solvent.

Thereafter, the cathode C is formed of a metal film such as Al on the electron transport layer ETL. Thereby, a structure illustrated in FIG. 1 is obtained.

The metal film of the cathode C is formed by vacuum deposition, electron beam deposition, or the like. The film thickness of the cathode C may not be excessively small. Further, in the present embodiment, the cathode C is made of an opaque metal, and thus functions as a reflective electrode. However, the cathode C may be a transparent electrode formed of ITO or the like and may function as an electrode on a side where light emitted by the light-emitting layer EML is extracted from the light-emitting device EL. Since the cathode C has a sufficient reflection function when the film thickness thereof is approximately 20 nm, the film thickness may be equal to or larger than 20 nm, and is preferably, for example, approximately 300 nm.

Second Embodiment

Next, a light-emitting device EL according to a second embodiment will be described. The light-emitting device EL of the present embodiment is substantially the same as the light-emitting device EL of the first embodiment. For this reason, description of points similar to those of the light-emitting device EL of the first embodiment will not be repeated below as long as description is not required. The light-emitting device EL of the present embodiment differs from the light-emitting device EL of the first embodiment in the following respects.

The light-emitting device EL according to the second embodiment will be described with reference to FIG. 18.

Figure 18:
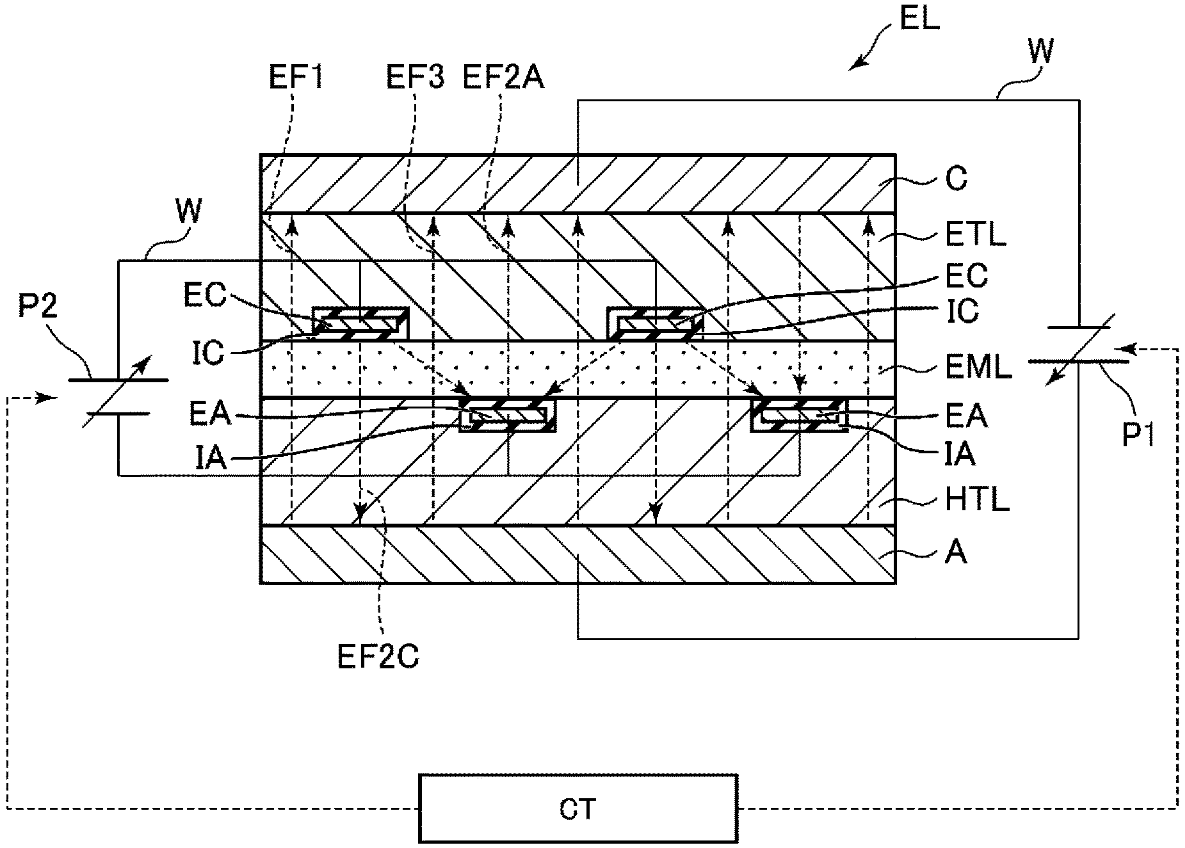
FIG. 18 is a schematic cross-sectional view of a light-emitting device according to a second embodiment.

As illustrated in FIG. 18, a first electrode EA and a second electrode EC are disposed shifted from an arrangement in which the first electrode EA and the second electrode EC face each other in a state where the light-emitting layer EML is present between the first electrode EA and the second electrode EC. For this reason, a more uniform electric field can be generated in a wider range of the light-emitting layer EML. As a result, the luminous efficiency of the light-emitting device EL can be further improved.

Figure 19:
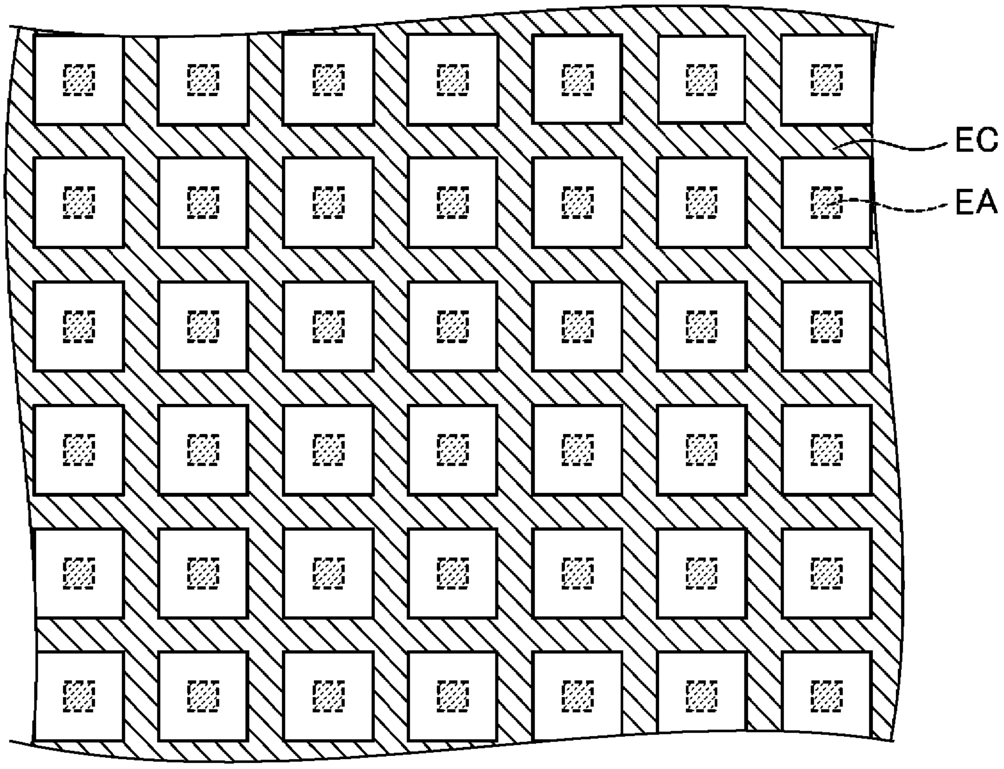
FIG. 19 is a plan view illustrating a state where a box-shaped first electrode and a mesh-shaped second electrode of the light-emitting device according to the second embodiment are disposed not facing each other.
Figure 20:
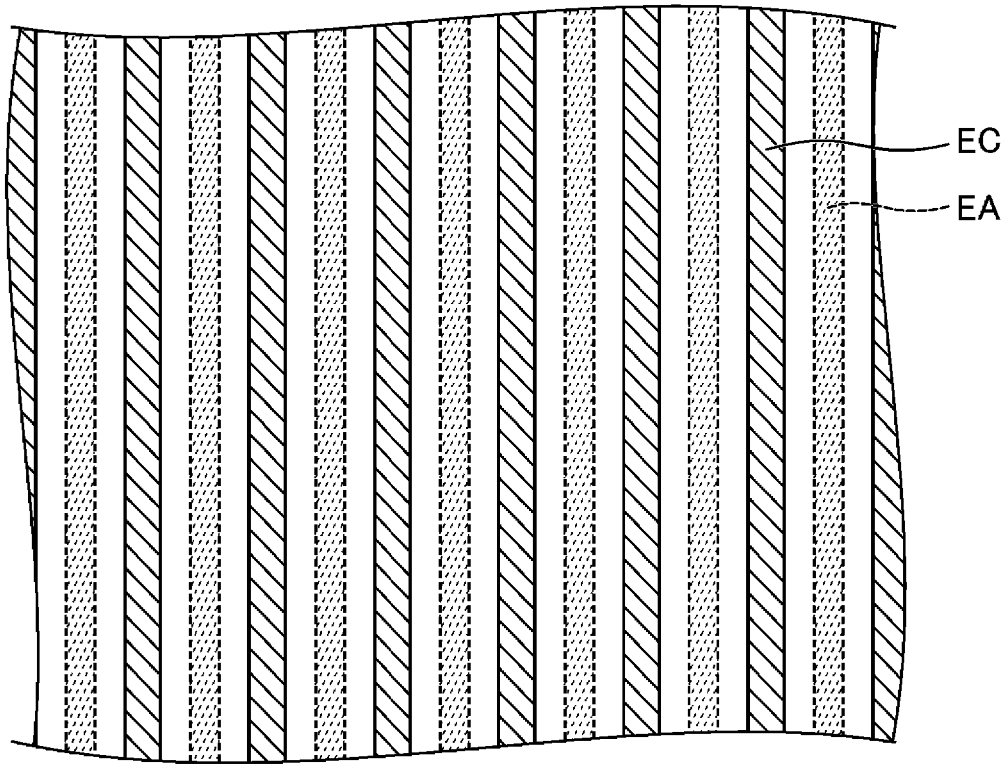
FIG. 20 is a plan view illustrating a state where a first line-and-space electrode and a second line-and-space electrode are disposed not facing each other according to a modified example of the light-emitting device according to the second embodiment.

With reference to FIG. 19 and FIG. 20, a planar shape of each of the first electrodes EA and the second electrodes EC of the light-emitting device EL according to the present embodiment and the modified example thereof will be described.

As illustrated in FIG. 19, the first electrode EA has a rectangular or square shape in a plan view. The second electrode EC has a mesh shape in a plan view. However, as illustrated in FIG. 20, each of the first electrode EA and the second electrode EC may have a line-and-space shape, and lines may be disposed shifted from each other in a plan view.

According to such a configuration, a path through which positive holes can pass can be left between the light-emitting layer EML and the anode A, and a path through which electrons can pass can be left between the light-emitting layer EML and the cathode C. In addition, a second electric field EF2A, another second electric field EF2C, and a third electric field EF3 for canceling at least a portion of a first electric field EF1 can be generated in a wide range of the light-emitting layer EML. As a result, the luminous efficiency of the light-emitting device EL can be improved. However, each of the first electrode EA and the second electrode EC may have any planar shape as long as they do not face each other.

Note that, similarly to the light-emitting device EL according to the first embodiment, also in the light-emitting device EL according to the present embodiment, an initial electric field may be naturally generated in the light-emitting layer EML in a state where no voltage is applied between the anode A and the cathode C. Further, the direction of the initial electric field may be opposite to the direction of the first electric field EF1, and the value of the initial electric field may be larger than the first electric field EF1. In this case, for example, the directions of the first electric field EF1, the second electric field EF2A, the other second electric field EF2C, and the third electric field EF3 may be the same. In other words, the direction of each of the first electric field EF1, the second electric field EF2A, the other second electric field EF2C, and the third electric field EF3 may be any direction as long as the total electric field generated in the light-emitting layer EML can be made close to zero.

Figure 21:
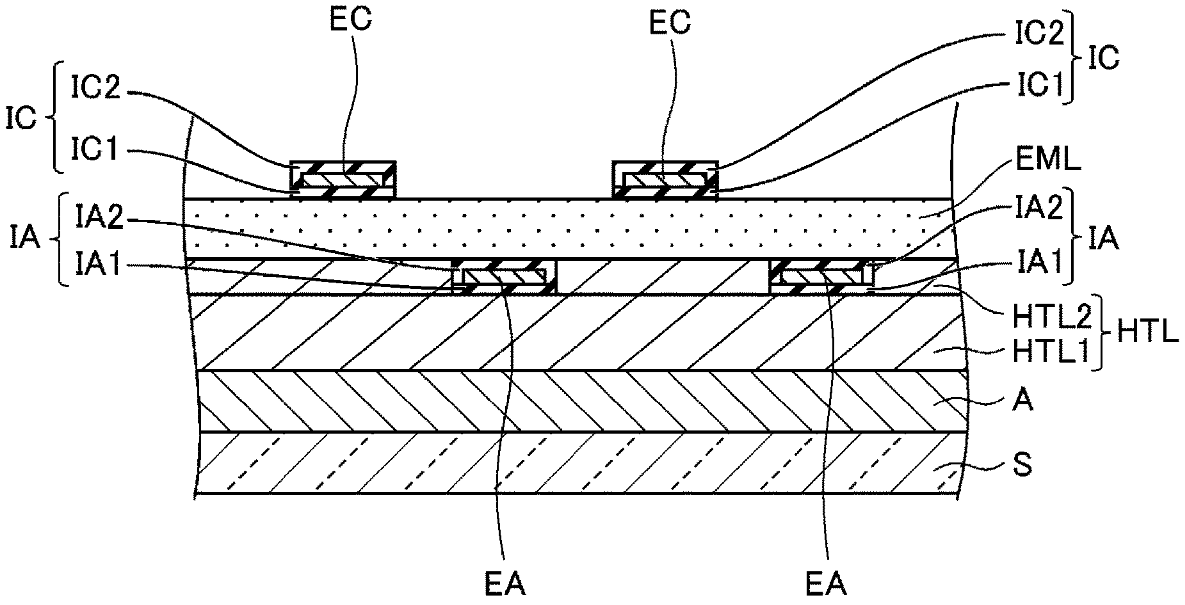
FIG. 21 is a schematic first cross-sectional view illustrating a method of manufacturing the light-emitting device according to the second embodiment.
Figure 22:
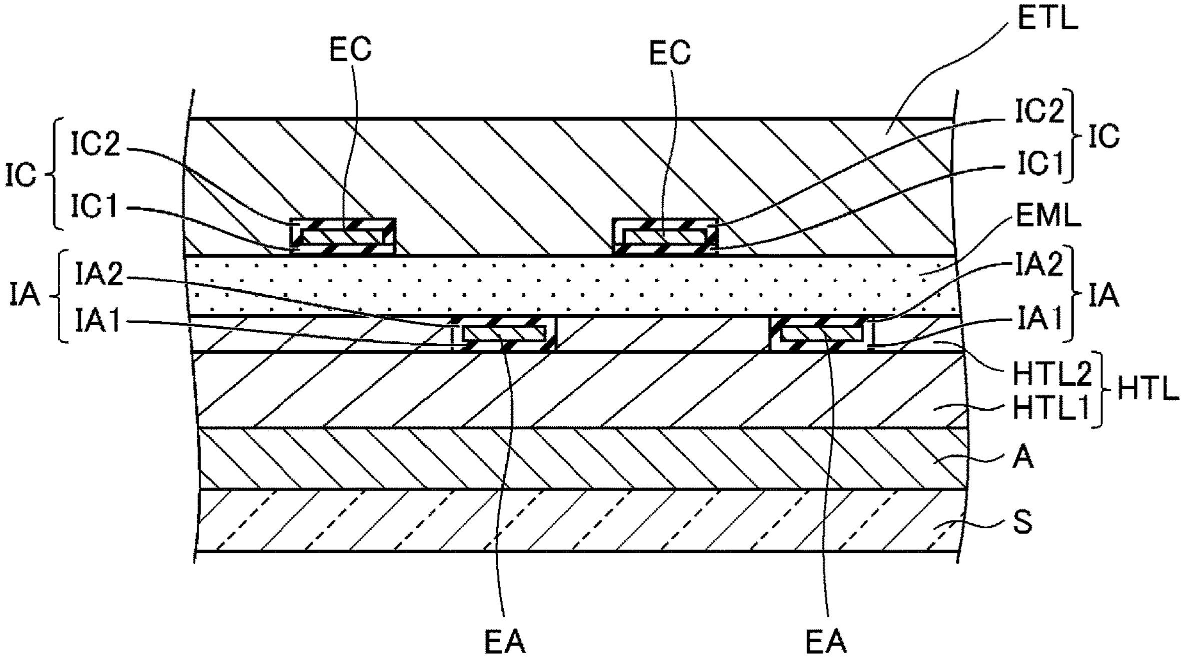
FIG. 22 is a schematic second cross-sectional view illustrating a method of manufacturing the light-emitting device according to the second embodiment.

A method of manufacturing the light-emitting device EL according to the present embodiment will be described with reference to FIG. 21 and FIG. 22.

In the method of manufacturing the light-emitting device EL of the present embodiment, steps up to the formation of the light-emitting layer EML illustrated in FIG. 15 are the same as the steps for the light-emitting device EL of the first embodiment. Thereafter, as illustrated in FIG. 21, a second insulating film IC and the second electrode EC are formed on the light-emitting layer EML at positions where the first electrode EA and the second electrode EC are shifted from each other in a plan view, that is, so that the first electrode EA and the second electrode EC do not face each other.

A method of forming the second insulating film IC and the second electrode EC in the present embodiment is the same as the method of forming the second insulating film IC and the second electrode EC in the first embodiment. Thereafter, as illustrated in FIG. 22, the electron transport layer ETL is formed to cover the light-emitting layer EML and the second insulating film IC. Finally, the cathode C is formed on the electron transport layer ETL. Thereby, a structure illustrated in FIG. 18 is formed.

Third Embodiment

A display device D using the light-emitting device EL according to the first embodiment will be described with reference to FIG. 23. A light-emitting device EL included in the display device D of the present embodiment is substantially the same as the light-emitting device EL of the first embodiment. For this reason, description of points similar to those of the light-emitting device EL of the first embodiment will not be repeated below as long as description is not required. Note that the light-emitting device EL according to the second embodiment may be used instead of the light-emitting device EL according to the first embodiment.

Figure 23:
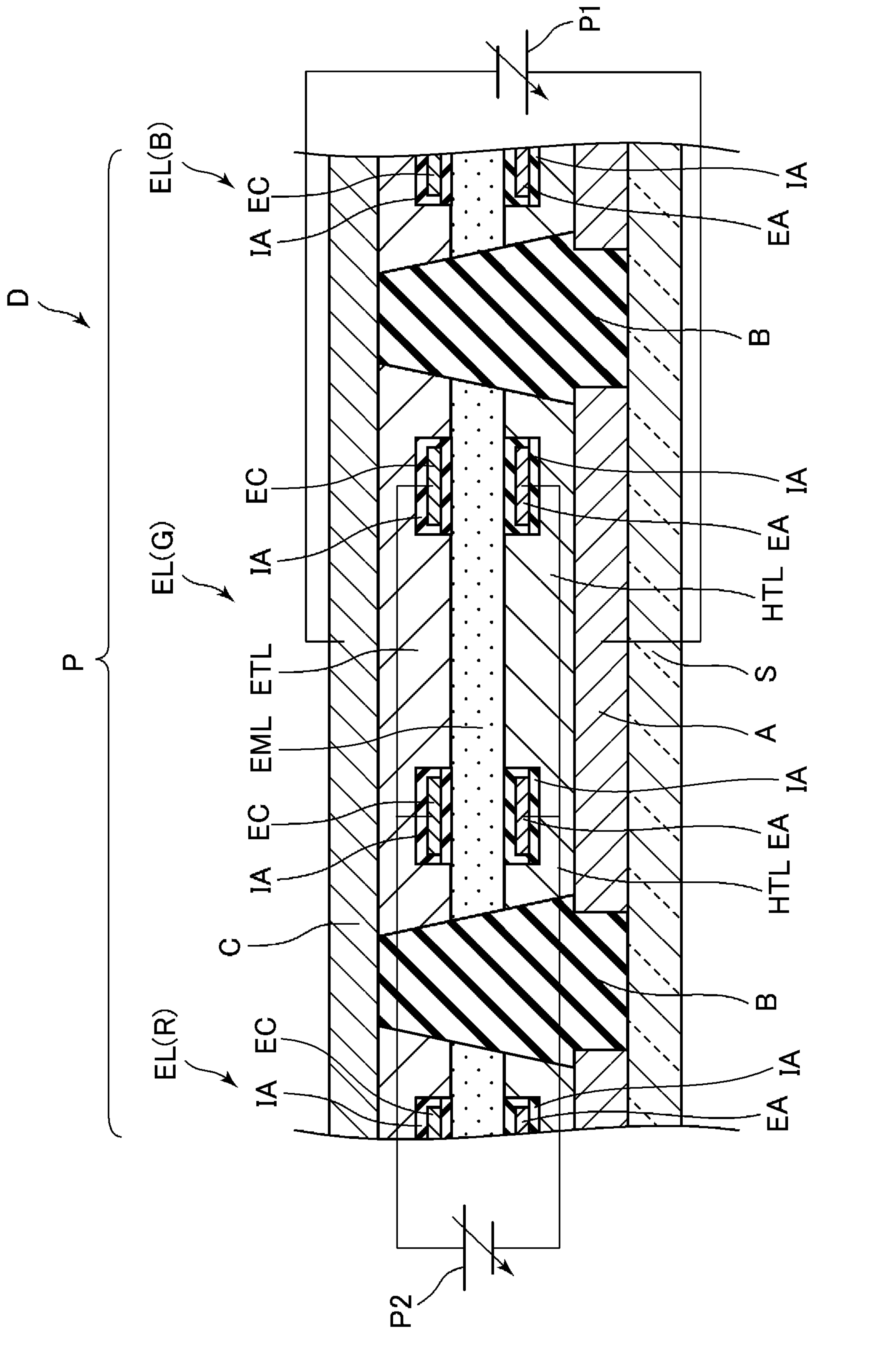
FIG. 23 is a schematic cross-sectional view of a display device according to a third embodiment.

As can be seen from FIG. 23, the display device D includes a bank B surrounding a hole transport layer HTL, a first electrode EA, and a second electrode EC. A portion surrounded by the bank B functions as a red subpixel EL (R), a green subpixel EL (G), and a blue subpixel EL (B) of the display device D. According to the display device D of the present embodiment, a structure similar to that of the light-emitting device EL according to the first embodiment or the second embodiment can be used for each subpixel. Thereby, it is possible to improve the luminous efficiency of the entire screen of the display device D.

Fourth Embodiment

Figure 24:
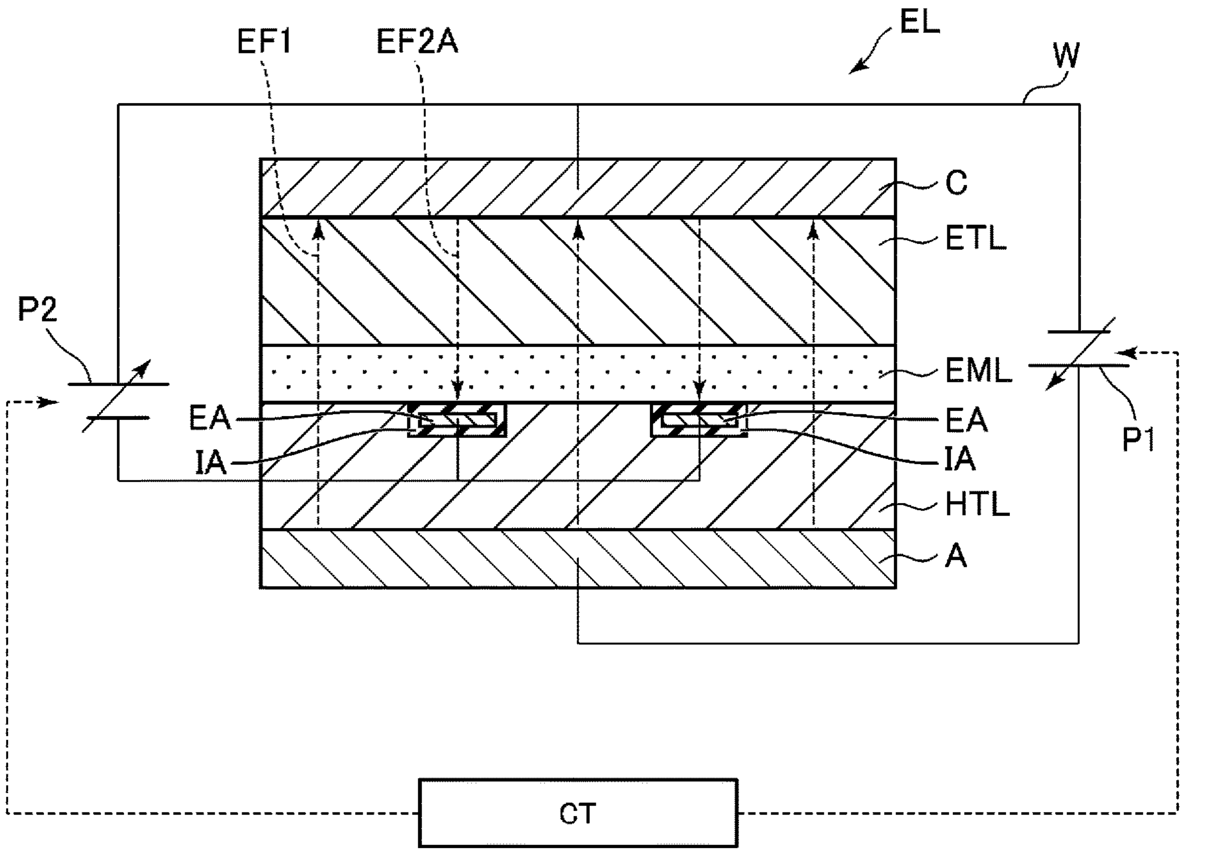
FIG. 24 is a schematic cross-sectional view of a light-emitting device according to a fourth embodiment.

A light-emitting device EL according to a fourth embodiment will be described with reference to FIG. 24. The light-emitting device EL of the present embodiment is substantially the same as the light-emitting device EL of the first embodiment. For this reason, description of points similar to those of the light-emitting device EL of the first embodiment will not be repeated below as long as description is not required. The light-emitting device EL of the present embodiment differs from the light-emitting device EL of the first embodiment in the following respects.

The light-emitting device EL of the present embodiment includes a first electrode EA and a first insulating film IA, but does not include the second electrode EC and the second insulating film IC described in the first embodiment. The first electrode EA is disposed between a light-emitting layer EML and an anode A as in the first embodiment. Similarly to the first embodiment, in the first insulating film IA, the first electrode EA is insulated from the anode A, a cathode C, and the light-emitting layer EML. Further, the first insulating film IA surrounds the first electrode EA in a cross-sectional view of the light-emitting layer EML, the anode A, and the cathode C.

Similarly to the first embodiment, a first power supply Pl is electrically connected to the anode A and the cathode C, and generates a first electric field EF1 between the anode A and the cathode C. However, a second power supply P2 is electrically connected to the cathode C and the first electrode EA, and generates a second electric field EF2A in a direction opposite to the first electric field EF1 between the cathode C and the first electrode EA. Note that it is sufficient that the second power supply P2 be able to bring the total electric field generated in the light-emitting layer EML close to zero by electrically connecting the cathode C and the first electrode EA to generate the electric field EF2A, and the direction of the second electric field EF2A is not necessarily opposite to the direction of the first electric field EF1. For example, when the second electric field EF2A is smaller than the first electric field EF1 even when the potential of the first electrode EA is higher than that of the cathode C, it is considered that the effect of the disclosure can be exhibited as long as the light-emitting layer EML is at least in the vicinity of the first electrode EA.

A control unit CT controls the first power supply P1 and the second power supply P2 so that a first period T1 in which the first electric field EF1 is generated and a second period T2 in which the second electric field EF2A is generated are synchronized with each other.

According to the light-emitting device EL of the present embodiment, similarly to the light-emitting device EL of the first embodiment, it is also possible to improve the luminous efficiency of the light-emitting device EL.

Fifth Embodiment

Figure 25:
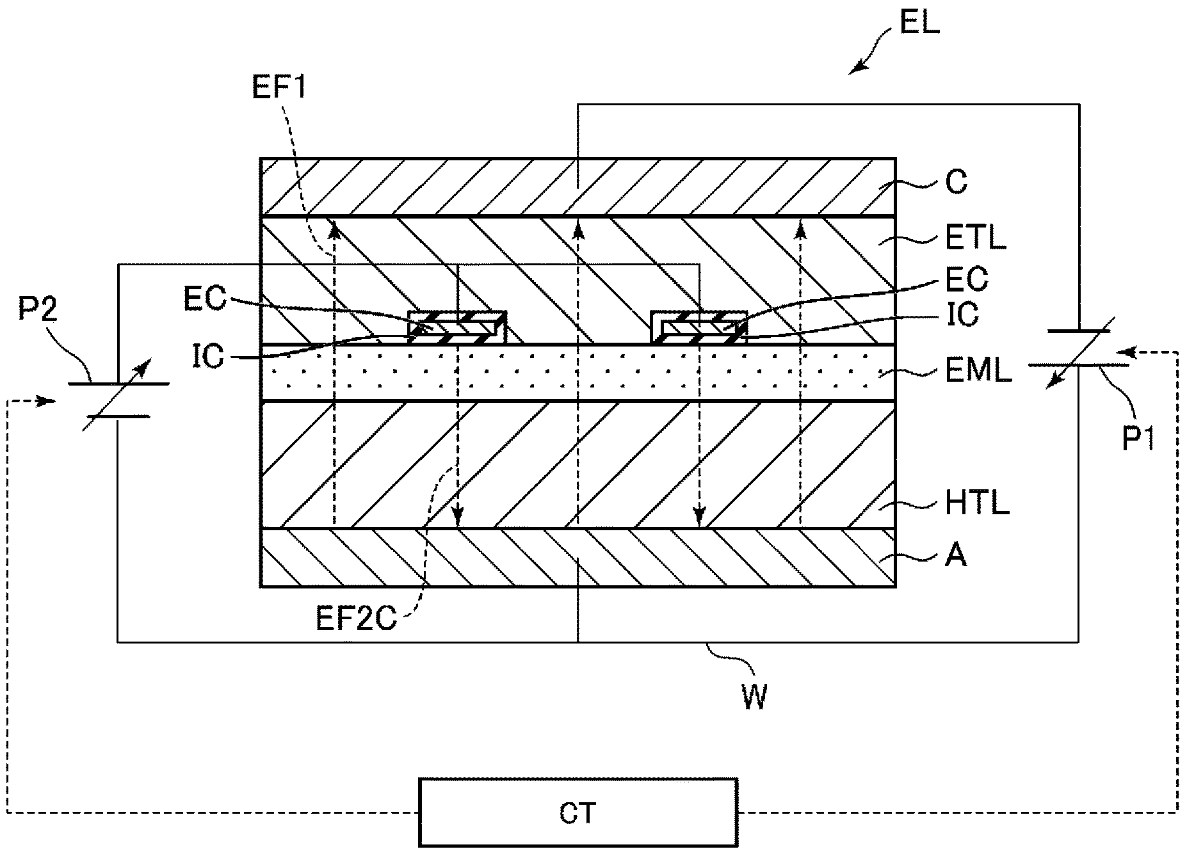
FIG. 25 is a schematic cross-sectional view of a light-emitting device according to a fifth embodiment.

A light-emitting device EL according to a fifth embodiment will be described with reference to FIG. 25. The light-emitting device EL of the present embodiment is substantially the same as the light-emitting device EL of the first embodiment. For this reason, description of points similar to those of the light-emitting device EL of the first embodiment will not be repeated below as long as description is not required. The light-emitting device EL of the present embodiment differs from the light-emitting device EL of the first embodiment in the following respects.

The light-emitting device EL of the present embodiment includes a second electrode EC and a second insulating film IC, but does not include the first electrode EA and the first insulating film IA described in the first embodiment. The second electrode EC is disposed between a light-emitting layer EML and a cathode C. The second insulating film IC insulates the second electrode EC from an anode A, the cathode C, and the light-emitting layer EML. Further, the second insulating film IC surrounds the second electrode EC in a cross-sectional view of the light-emitting layer EML, the anode A, and the cathode C.

Similarly to the first embodiment, a first power supply Pl is electrically connected to the anode A and the cathode C, and generates a first electric field EF1 between the anode A and the cathode C. A second power supply P2 is electrically connected to the anode A and the second electrode EC and generates another second electric field EF2C between the anode A and the second electrode EC. The second power supply P2 may generate a second electric field EF2C in a direction opposite to the first electric field EFI between the anode A and the second electrode EC. Note that it is sufficient that the second power supply P2 be able to bring the total electric field generated in the light-emitting layer EML close to zero by electrically connecting the anode A and the second electrode EC to generate the second electric field EF2C, and the direction of the second electric field EF2C is not necessarily opposite to the direction of the first electric field EF1. For example, when the second electric field EF2C is smaller than the first electric field EF1 even when the potential of the second electrode EC is lower than that of the anode A, it is considered that the effect of the disclosure can be exhibited as long as the light-emitting layer EML is at least in the vicinity of the second electrode EC.

According to the light-emitting device EL of the present embodiment, similarly to the light-emitting device EL of the first embodiment, it is also possible to improve the luminous efficiency of the light-emitting device EL.

Sixth Embodiment

Figure 26:
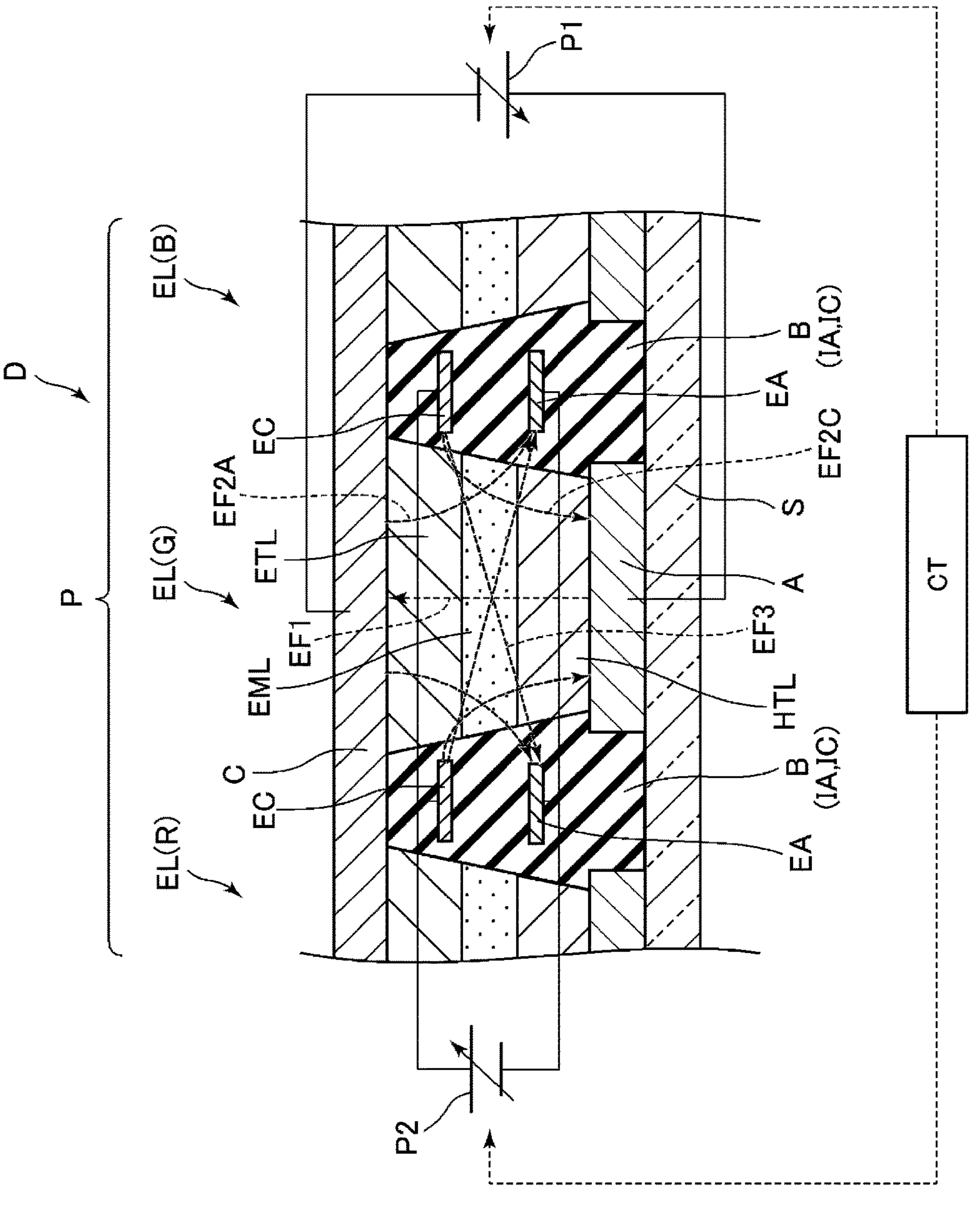
FIG. 26 is a schematic cross-sectional view of a display device according to a sixth embodiment.

A display device D according to the present embodiment will be described with reference to FIG. 26. The display device D includes a light-emitting device EL which is substantially the same as the light-emitting device EL of the first embodiment. However, the light-emitting device EL of the present embodiment differs from the light-emitting device EL of the first embodiment in the following respects.

The light-emitting device EL of the present embodiment includes a bank B in contact with a hole transport layer HTL which is a portion of a part between an anode A and a cathode C. The bank B functions as an insulating portion. A first electrode EA is disposed on one side from among one side and the other side of the light-emitting layer EML, specifically, on the anode A side so as to be surrounded by the bank B serving as an insulating portion. That is, the first electrode EA is disposed closer to the anode A than a virtual layer obtained by extending the light-emitting layer EML in a direction extending in an in-plane direction of both main surfaces of the light-emitting layer EML which face each other. The first electrode EA is embedded in, for example, the bank B surrounding a green subpixel EL(G) of the display device D in a plan view. Thus, in the present embodiment, the bank B exhibits the same function as the first insulating film IA described in the first embodiment. The bank B is formed by integrally providing the first insulating film IA and the second insulating film IC described in the first embodiment as one insulating portion.

The light-emitting device EL of the present embodiment includes the bank B in contact with an electron transport layer ETL which is another part of the portion between the anode A and the cathode C. The bank B functions as an insulating portion. The second electrode EC is disposed on the other side from among the one side and the other side of the light-emitting layer EML, specifically, on the cathode C side so as to be surrounded by the bank B. That is, the second electrode EC is disposed closer to the cathode C than a virtual layer obtained by extending the light-emitting layer EML in a direction extending in an in-plane direction of both main surfaces of the light-emitting layer EML which face each other. That is, the second electrode EC is embedded in, for example, the bank B surrounding a green subpixel EL (G) of the display device D in a plan view. For this reason, in the present embodiment, the bank B as the insulating portion exhibits the same function as the second insulating film IC in the first embodiment. The bank B is formed by integrally providing the first insulating film IA and the second insulating film IC described in the first embodiment as one insulating portion.

According to the light-emitting device EL of the present embodiment, similarly to the first embodiment, it is also possible to improve the luminous efficiency of the light-emitting device EL. Further, the first electrode EA and the second electrode EC are disposed at positions other than positions between the anode A and the cathode C. The positions other than the positions between the anode A and the cathode C are positions that are not sandwiched between the anode A and the cathode C. More specifically, the cathode C is provided on the upper side of the bank B, but the anode A is not provided on the lower side of the bank B. For this reason, in the disclosure, it is assumed that the first electrode EA and the second electrode EC in the bank B are provided at positions other than positions between the anode A and the cathode C.

Note that, in the disclosure, also when the anode A is provided on the lower side of the bank B and the cathode C is not provided on the upper side of the bank B, it is assumed that the first electrode EA and the second electrode EC in the bank B are provided at positions other than positions between the anode A and the cathode C. Further, in the disclosure, also when the anode A is not provided on the lower side of the bank B and the cathode C is not provided on the upper side of the bank B, it is assumed that the first electrode EA and the second electrode EC in the bank B are provided at positions other than positions between the anode A and the cathode C.

That is, when the anode A and the cathode C extend parallel to each other, there is a position between the anode A and the cathode C. When the anode A and the cathode C are not parallel to each other, there is a position other than a position between the anode A and the cathode C. In other words, a region where the anode A and the anode C overlap each other in a plan view corresponds to a position between the anode A and the cathode C. A region where the anode A and the anode C do not overlap each other in a plan view corresponds to a position other than a position between the anode A and the cathode C.

According to the light-emitting device EL of the present embodiment as described above, since the positions where the first electrode EA and the second electrode EC are installed are positions outside the position between the anode A and the cathode C, it is possible to increase the degree of freedom in designing the structure from the anode A to the cathode C.

Also in the light-emitting device EL according to the present embodiment, there is a case where an initial electric field is naturally generated in the light-emitting layer EML in a state where no voltage is applied between the anode A and the cathode C, similarly to the light-emitting device EL according to the first or second embodiment. Further, the direction of the initial electric field may be opposite to the direction of a first electric field EF1, and the value of the initial electric field may be larger than the first electric field EF1. In this case, for example, the directions of the first electric field EF1, a second electric field EF2A, another second electric field EF2C, and a third electric field EF3 may be the same. In other words, the direction of each of the first electric field EF1, the second electric field EF2A, the other second electric field EF2C, and the third electric field EF3 may be any direction as long as the total electric field generated in the light-emitting layer EML can be made close to zero.

Seventh Embodiment

Figure 27:
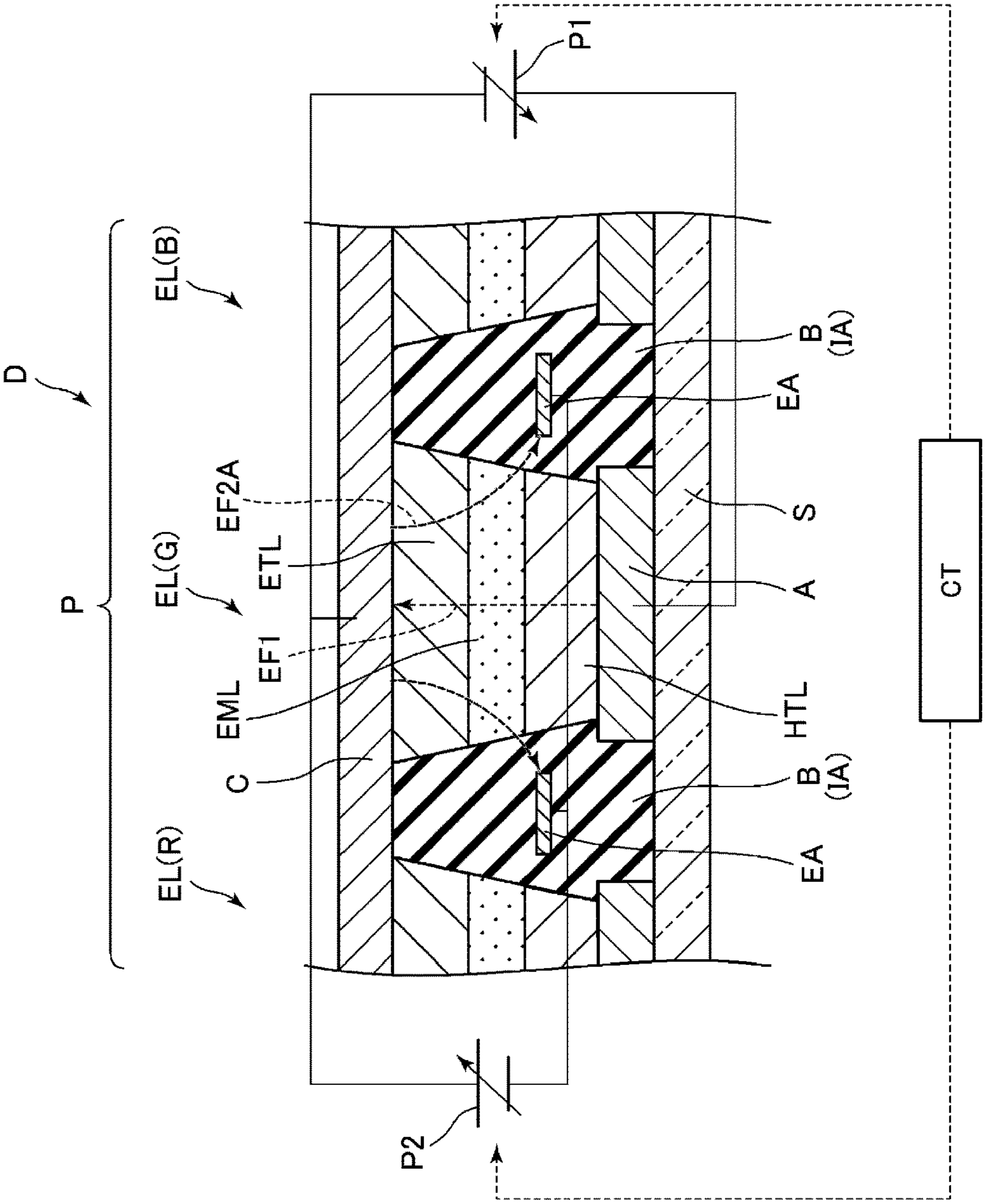
FIG. 27 is a schematic cross-sectional view of a display device according to a seventh embodiment.

A display device D according to the present embodiment will be described with reference to FIG. 27. A light-emitting device EL included in the display device D of the present embodiment is substantially the same as the light-emitting device EL of the sixth embodiment. Note that description of points similar to those of the display device D according to the sixth embodiment will not be repeated below as long as description is not required. The display device D of the present embodiment differs from the display device D of the sixth embodiment in the following respects.

In the display device D according to the present embodiment, a first electrode EA is provided in a bank B serving as an insulating portion similarly to the sixth embodiment, but a second electrode EC is not provided unlike the sixth embodiment. The first electrode EA is disposed on one side from among one side and the other side of a light-emitting layer EML, specifically, on an anode A side so as to be surrounded by the bank B serving as an insulating portion.

According to the light-emitting device EL of the present embodiment, similarly to the first embodiment, it is also possible to improve the luminous efficiency of the light-emitting device EL. In addition, the first electrode EA is disposed at a position other than a position between the anode A and a cathode C. For this reason, it is possible to increase the degree of freedom in designing the structure from the anode A to the cathode C.

Eighth Embodiment

Figure 28:
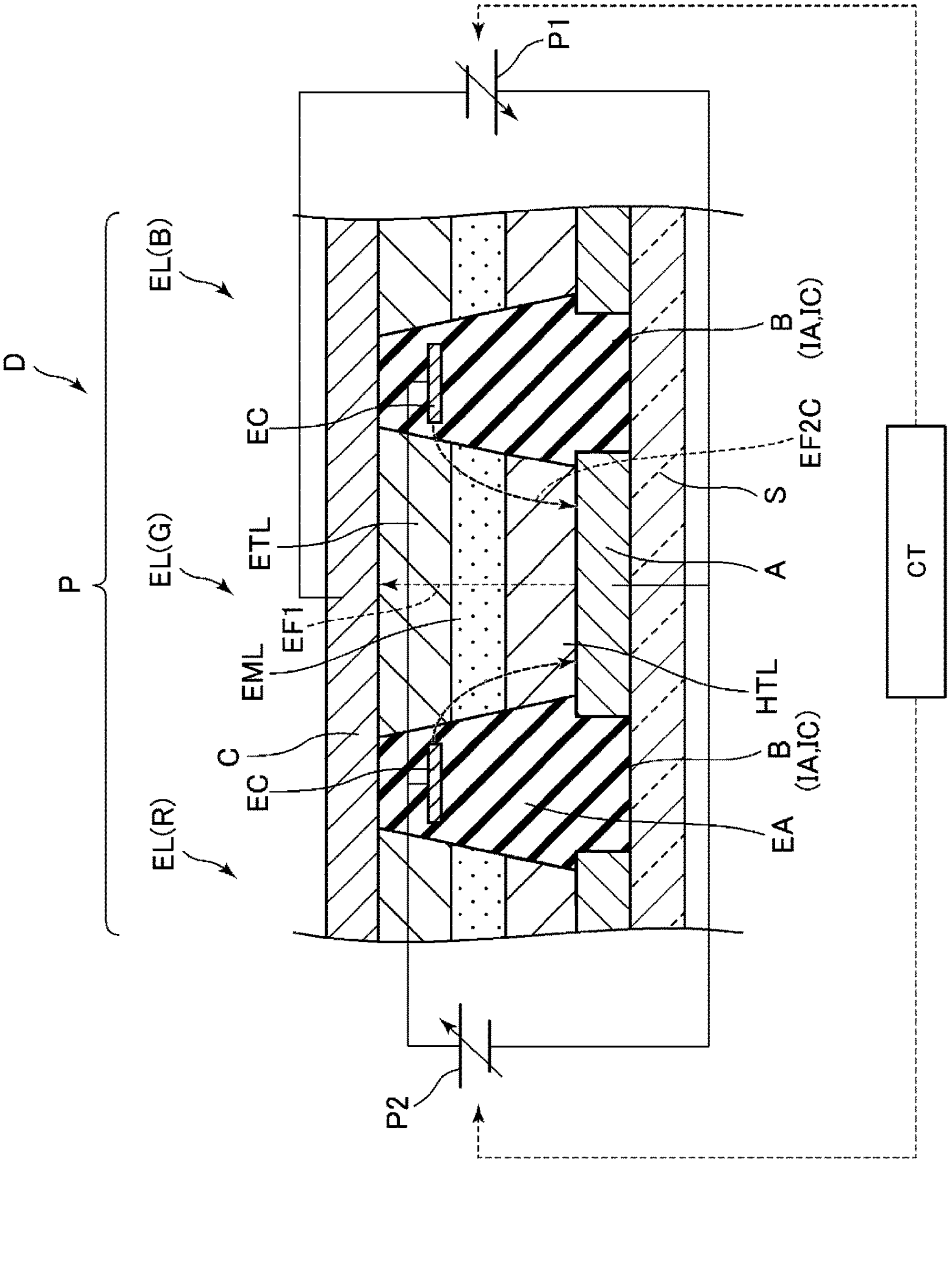
FIG. 28 is a schematic cross-sectional view of a display device according to an eighth embodiment.

A display device D according to the present embodiment will be described with reference to FIG. 28. A light-emitting device EL included in the display device D of the present embodiment is substantially the same as the light-emitting device EL of the sixth embodiment. Note that description of points similar to those of the display device D according to the sixth embodiment will not be repeated below as long as description is not required. However, the display device D of the present embodiment differs from the display device D of the sixth embodiment in the following respects.

In the display device D according to the present embodiment, a second electrode EC is provided in a bank B serving as an insulating portion similarly to the sixth embodiment, but a first electrode EA is not provided unlike the sixth embodiment. The second electrode EC is disposed on the other side from among one side and the other side of a light-emitting layer EML, specifically, on a cathode C side so as to be surrounded by the bank B serving as an insulating portion.

According to the light-emitting device EL of the present embodiment, similarly to the first embodiment, it is also possible to improve the luminous efficiency of the light-emitting device EL. In addition, the second electrode EC is disposed at a position other than a position between the anode A and a cathode C. For this reason, it is possible to increase the degree of freedom in designing the structure from the anode A to the cathode C.

The invention claimed is:

1. A light-emitting device comprising:

an anode;

a cathode;

a light-emitting layer disposed between the anode and the cathode;

a first electrode disposed in a manner such that the first electrode generates a second electric field in the light-emitting layer in cooperation with one of the anode and the cathode, the second electric field bringing a total electric field, which is generated in the light-emitting layer and includes a first electric field generated in the light-emitting layer between the anode and the cathode, close to zero;

a first insulating portion surrounding the first electrode in a cross-sectional view of the anode, the cathode, and the light-emitting layer;

a second electrode disposed in a manner such that the second electrode generates an additional second electric field in the light-emitting layer in cooperation with the other one of the anode and the cathode that is not cooperating with the first electrode, and generates a third electric field in the light-emitting layer in cooperation with the first electrode, the second electric field and the third electric field bringing the total electric field close to zero; and a second insulating portion provided integrally with the first insulating portion or separately from the first insulating portion, and surrounding the second electrode in the cross-sectional view of the anode, the cathode, and the light-emitting layer, wherein each of the second electric field and the additional second electric field has a component in a direction opposite to that of the first electric field.

2. The light-emitting device according to claim 1, further comprising:

a first power supply electrically connected to the anode and the cathode to generate the first electric field between the anode and the cathode; and a second power supply electrically connected to the first electrode and the one of the anode and the cathode to generate the second electric field between the first electrode and the one of the anode and the cathode.

3. The light-emitting device according to claim 2, further comprising a control unit configured to control the first power supply and the second power supply such that a first period in which the first electric field is generated and a second period in which the second electric field is generated are synchronized with each other.

4. The light-emitting device according to claim 1, further comprising:

a first power supply electrically connected to the anode and the cathode to generate the first electric field between the anode and the cathode; and a second power supply electrically connected to the first electrode and the second electrode to generate the second electric field between the cathode and the first electrode, generate the other additional second electric field between the anode and the second electrode, and generate the third electric field between the first electrode and the second electrode.

5. The light-emitting device according to claim 4, further comprising a control unit configured to control the first power supply and the second power supply such that a first period in which the first electric field is generated, a second period in which the second electric field is generated, and a third period in which the third electric field is generated are synchronized with each other.

6. The light-emitting device according to claim 1, wherein the first electrode and the second electrode are disposed shifted from an arrangement in which the first electrode and the second electrode face each other in a state where the light-emitting layer is present between the first electrode and the second electrode.

7. A light-emitting device comprising:

an anode;

a cathode;

a light-emitting layer disposed between the anode and the cathode;

a first electrode disposed at one of a first position between the light-emitting layer and the anode, and a second position between the light-emitting layer and the cathode;

a first insulating film surrounding the first electrode in a cross-sectional view of the anode, the cathode, and the light-emitting layer;

a second electrode disposed at the other one of the first position and the second position, where the first electrode is not disposed; and a second insulating film surrounding the second electrode in the cross-sectional view of the anode, the cathode, and the light-emitting layer.

8. The light-emitting device according to claim 7, further comprising:

a first power supply electrically connected to the anode and the cathode to generate a first electric field in the light-emitting layer between the anode and the cathode; and a second power supply electrically connected to any one of the anode and the cathode to generate a second electric field in the light-emitting layer between the one of the anode and the cathode, the second electric field bringing a total electric field, generated in the light-emitting layer and including the first electric field, close to zero.

9. The light-emitting device according to claim 8, further comprising a control unit configured to control the first power supply and the second power supply such that a first period in which the first electric field is generated and a second period in which the second electric field is generated are synchronized with each other.

10. The light-emitting device according to claim 7, further comprising:

a first power supply electrically connected to the anode and the cathode to generate a first electric field in the light-emitting layer between the anode and the cathode; and a second power supply electrically connected to the first electrode and the second electrode to generate a second electric field in the light-emitting layer between the first electrode and any-one of the anode and the cathode, the second electric field for:

bringing a total electric field generated in the light-emitting layer close to zero, generating an additional second electric field in the light-emitting layer between the second electrode and the other one of the anode and the cathode, the additional second electric field bringing the total electric field close to zero, and generating a third electric field in the light-emitting layer between the first electrode and the second electrode, the third electric field bringing the total electric field close to zero.

11. The light-emitting device according to claim 10, further comprising a control unit configured to control the first power supply and the second power supply such that a first period in which the first electric field is generated, a second period in which the second electric field is generated, and a third period in which the third electric field is generated are synchronized with each other.

12. The light-emitting device according to claim 7, wherein the first electrode and the second electrode are disposed facing each other in a state in which the light-emitting layer is present between the first electrode and the second electrode.

* * * * *